United States Patent
Ohtani et al.

(10) Patent No.: US 6,559,036 B1
(45) Date of Patent: May 6, 2003

(54) SEMICONDUCTOR DEVICE AND METHOD OF MANUFACTURING THE SAME

(75) Inventors: Hisashi Ohtani, Kanagawa (JP); Tamae Takano, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/369,158

(22) Filed: Aug. 6, 1999

(30) Foreign Application Priority Data

| Aug. 7, 1998 | (JP) | 10-225067 |
| Aug. 7, 1998 | (JP) | 10-225070 |
| Sep. 9, 1998 | (JP) | 10-255494 |
| Sep. 9, 1998 | (JP) | 10-255495 |
| Sep. 9, 1998 | (JP) | 10-255496 |
| Sep. 9, 1998 | (JP) | 10-255497 |

(51) Int. Cl.$^7$ .......................... H01L 21/20; H01L 21/36
(52) U.S. Cl. ................ 438/486; 438/487; 438/509; 438/166
(58) Field of Search ............... 438/149, 162, 438/488, 509, 486, 166, 158, 160, 164, 165, 167, 150, 487, 143, 473, 478, 482

(56) References Cited

U.S. PATENT DOCUMENTS

| 4,986,213 A | 1/1991 | Yamazaki et al. |
| 5,147,826 A | 9/1992 | Liu et al. |
| 5,365,875 A | 11/1994 | Asai et al. |
| 5,403,772 A | 4/1995 | Zhang et al. |
| 5,426,064 A | 6/1995 | Zhang et al. |
| 5,461,250 A | 10/1995 | Burghartz |

(List continued on next page.)

FOREIGN PATENT DOCUMENTS

| JP | 07-130652 | 5/1995 |
| JP | 8-78329 | 3/1996 |

OTHER PUBLICATIONS

Inventors: Shunpei Yamazaki, Specifications and Drawings for Application Ser. No. 09/352,362 Filing Date: Jul. 13, 1999, "Crystalline, Semiconductor Thin Film, Method of Fabricating the Same, Semiconductor Device, and Method of Fabricating the Same".

Inventors: Shunpei Yamazaki et al., Specifications and Drawings for Application Ser. No. 09/352,373 Filing Date: Jul. 13, 1999, "Crystalline Semiconductor Thin Film, Method of Fabricating the Same, Semiconductor Device, and Method of Fabricating the Same".

(List continued on next page.)

*Primary Examiner*—Phat X. Cao
*Assistant Examiner*—Theresa T. Doan
(74) *Attorney, Agent, or Firm*—Eric J. Robinson; Robinson Intellectual Property Law Office, P.C.

(57) ABSTRACT

There is provided a method in which a TFT with superior electrical characteristics is manufactured and a high performance semiconductor device is realized by assembling a circuit with the TFT. The method of manufacturing the semiconductor device includes: a step of forming a crystal-containing semiconductor film by carrying out a thermal annealing to a semiconductor film; a step of carrying out an oxidizing treatment to the crystal-containing semiconductor film; a step of carrying out a laser annealing treatment to the crystal-containing semiconductor film after the oxidizing treatment has been carried out; and a step of carrying out a furnace annealing treatment to the crystal-containing semiconductor film after the laser annealing. The laser annealing treatment is carried out with an energy density of 250 to 5000 mJ/cm$^2$.

66 Claims, 16 Drawing Sheets

U.S. PATENT DOCUMENTS

| | | |
|---|---|---|
| 5,481,121 A | 1/1996 | Zhang et al. |
| 5,492,843 A | 2/1996 | Adachi et al. |
| 5,514,879 A | 5/1996 | Yamazaki |
| 5,529,937 A * | 6/1996 | Zhang et al. ............... 438/471 |
| 5,569,610 A | 10/1996 | Zhang et al. |
| 5,578,520 A | 11/1996 | Zhang et al. |
| 5,594,569 A | 1/1997 | Konuma et al. |
| 5,604,360 A | 2/1997 | Zhang et al. |
| 5,605,846 A | 2/1997 | Ohtani et al. |
| 5,616,506 A | 4/1997 | Takemura |
| 5,616,932 A | 4/1997 | Sano et al. |
| 5,620,910 A | 4/1997 | Termoto |
| 5,639,698 A | 6/1997 | Yamazaki et al. |
| 5,643,826 A * | 7/1997 | Ohtani et al. ............... 438/162 |
| 5,648,276 A | 7/1997 | Hara et al. |
| 5,693,541 A | 12/1997 | Yamazaki et al. |
| 5,696,386 A | 12/1997 | Yamazaki |
| 5,712,191 A | 1/1998 | Nakajima et al. |
| 5,789,762 A | 8/1998 | Koyama et al. |
| 5,795,795 A | 8/1998 | Kousai et al. |
| 5,808,321 A | 9/1998 | Mitanaga et al. |
| 5,837,619 A | 11/1998 | Adachi et al. |
| 5,843,833 A | 12/1998 | Ohtani et al. |
| 5,846,869 A | 12/1998 | Hashimoto et al. |
| 5,854,096 A | 12/1998 | Ohtani et al. |
| 5,869,363 A | 2/1999 | Yamazaki et al. |
| 5,879,974 A | 3/1999 | Yamazaki |
| 5,879,977 A | 3/1999 | Zhang et al. |
| 5,888,857 A | 3/1999 | Zhang et al. |
| 5,897,347 A | 4/1999 | Yamazaki et al. |
| 5,910,015 A | 6/1999 | Sameshima et al. |
| 5,923,962 A | 7/1999 | Ohtani et al. |
| 5,923,966 A | 7/1999 | Teramoto et al. |
| 5,953,597 A | 9/1999 | Kusumoto et al. |
| 5,956,579 A | 9/1999 | Yamazaki et al. |
| 5,960,323 A | 9/1999 | Wakita et al. |
| 5,985,740 A | 11/1999 | Yamazaki et al. |
| 5,994,172 A | 11/1999 | Ohtani et al. |
| 6,023,074 A | 2/2000 | Zhang |
| 6,027,960 A | 2/2000 | Kusumoto et al. |
| 6,054,739 A | 4/2000 | Yamazaki et al. |
| 6,071,764 A | 6/2000 | Zhang et al. |
| 6,071,766 A | 6/2000 | Yamazaki et al. |
| 6,071,796 A | 6/2000 | Voutsas |
| 6,077,731 A | 6/2000 | Yamazaki et al. |
| 6,077,758 A | 6/2000 | Zhang et al. |
| 6,093,937 A | 7/2000 | Yamazaki et al. |
| 6,096,581 A | 8/2000 | Zhang et al. |
| 6,121,076 A | 9/2000 | Zhang et al. |
| 6,124,154 A * | 9/2000 | Miyasaka ................... 438/151 |
| 6,140,165 A | 10/2000 | Zhang et al. |
| 6,180,439 B1 | 1/2001 | Yamazaki et al. |
| 6,197,624 B1 | 3/2001 | Yamazaki |
| 6,285,042 B1 | 9/2001 | Ohtani et al. |

OTHER PUBLICATIONS

Dorin et al., "Chemistry the Study of Matter", p. 532, 1992, Prentice Hall 4th Edition.

Inui et al., "Thresholdless Antiferroelectricity in Liquid Crystals and its Application to Displays", pp. 671–673, 1996, J. Mater. Chem. vol. 6, No. 4.

Shimokawa et al., "Characterization of High–Efficiency Cast–Si Solar Cell Wafers by MBIC Measurement", pp. 751–758, May 1988, Japanese Journal of Applied Physics, vol. 27, No. 5.

Yoshida et al., "33.2: A Full–Color Thresholdless Antiferroelectric LCD Exhibiting Wide Viewing Angle with Fast Response Time", pp. 841–844, 1997, SID 97 Digest.

Furue et al., "P–78: Characteristics and Driving Scheme of Polymer–Stabilized Monostable FLCD Exhibiting Fast Response Time and High Contrast Ratio with Gray–Scale Capability", pp. 782–785, 1998, SID 98 Digest.

Inventors: Shunpei Yamazaki et al., Specification & Drawings of U.S. patent application Ser. No. 09/352,198, 38 pages, Filed: Jul. 13, 1999, "Crystalline Semiconductor Thin Film, Method of Fabricating the Same, Semiconductor Device, and Method of Fabricating the Same".

Inventors: Shunpei Yamazaki et al., Specification & Drawings of U.S. patent application Ser. No. 09/352,194, 61 pages, Filed: Jul. 13, 1999, "Crystalline Semiconductor Thin Film, Method of Fabricating the Same, Semiconductor Device, and Method of Fabricating the Same".

Inventors: Shunpei Yamazaki et al., Specification & Drawings of U.S. patent application Ser. No. 09/894,125, 38 pages, Filed: Jun. 29, 2001, "Crystalline Semiconductor Thin Film, Method of Fabricating the Same, Semiconductor Device, and Method of Fabricating the Same".

Aya et al., "Improvement of SPC poly–Si Film Using the ELA Method", pp. 167–170, Sep. 11–12, 1997, AM–LCD.

Abe et al., "High–Performance Poly–Crystalline Silicon TFTs Fabricated Using the SPC and ELA Methods", pp. 85–88, Jul. 9–10, 1998, AM–LCD.

"Improvement of SPC poly–Si film using the ELA method" Aya et al., AM–LCD Sep. 11–12, 1997, pp. 167–170.

"High–Performance Poly–Crystalline Silicon TFTs Fabricated Using the SPC and ELA Methods" Abe et al., AM–LCD, Jul. 9–10, 1998, pp. 85–88.

* cited by examiner

THINNING

LASER ANNEALING

FURNACE ANNEALING

ADDING PHOSPHORUS

GETTERING

THINNING

LASER ANNEALING

FURNACE ANNEALING

LASER ANNEALING

THINNING

FURNACE ANNEALING

SEMICONDUCTOR DEVICE AND METHOD OF MANUFACTURING THE SAME

BACKGROUND OF THE INVENTION

1. Field of the Invention

The present invention relates to a semiconductor device which includes, as a circuit, a thin film transistor (hereinafter referred to as TFT) using a semiconductor thin film, and a technique regarding a method of manufacturing the same. Incidentally, in the present specification, the semiconductor device means any device which is made to function by using a semiconductor.

Thus, the term "semiconductor device" recited throughout this specification includes not only a single semiconductor component such as a TFT, but also an electro-optical device with TFTS, a semiconductor circuit, and an electronic equipment having those.

2. Description of the Related Art

In recent years, a TFT used for an electro-optical device such as an active matrix type liquid crystal display device has been actively developed. The active matrix type liquid crystal display device is a monolithic display device in which a pixel matrix circuit and a driver circuit are provided on the same substrate.

Moreover, recently, an experiment of forming a semiconductor circuit having a function comparable to a conventional IC by using TFTs provided on a substrate has also been made. For example, the development of a system-on-panel having a built-in logic circuit such as a γ-correction circuit, a memory circuit, and a clock generating circuit has been under review.

Since such a driver circuit or a logic circuit is required to perform a high speed operation, it is unsuitable to use an amorphous semiconductor film (typically, an amorphous silicon film) as an active layer. Thus, under the present circumstances, a crystalline semiconductor film (typically, a polysilicon film) has been examined.

However, when circuit performance comparable to a conventional IC comes to be required for a circuit assembled with TFTS, such circumstances have occurred that it is difficult to manufacture a TFT having satisfactory performance to meet the circuit specification by using a crystalline semiconductor film formed through a conventional technique.

SUMMARY OF THE INVENTION

An object of the present invention is therefore to realize a high performance semiconductor device by manufacturing TFTs each having electrical characteristics superior to a TFT using a conventional polysilicon film and by assembling a circuit with the TFTs.

According to one aspect of the present invention disclosed in this specification, a method of manufacturing a semiconductor device is characterized by comprising:

a first step of forming a crystal-containing semiconductor film;

a second step of oxidizing the crystal-containing semiconductor film to decrease its thickness;

a third step of carrying out a laser annealing treatment with an energy density of 250 to 5000 mJ/cm$^2$ to the crystal-containing semiconductor film after the second step; and a fourth step of carrying out a furnace annealing treatment to the crystal-containing semiconductor film after the third step.

According to another aspect of the present invention, a method of manufacturing a semiconductor device is characterized by comprising:

a first step of forming a crystal-containing semiconductor film;

a second step of oxidizing the crystal-containing semiconductor film to decrease its thickness;

a third step of carrying out a laser annealing treatment with an energy density of 250 to 5000 mJ/cm$^2$ to the crystal-containing semiconductor film after the second step; and a fourth step of carrying out a furnace annealing treatment at 900 to 1200° C. in a reduced atmosphere to the crystal-containing semiconductor film after the third step.

In the first step, the crystal-containing semiconductor film includes any semiconductor films containing crystalline components, and specifically indicates a single crystal semiconductor film, a polycrystal semiconductor film, a microcrystal semiconductor film, a semiconductor film of an amorphous semiconductor film only a part of which is crystallized, and a semiconductor film substantially regarded as a single crystal film.

Incidentally, the semiconductor film substantially regarded as the single crystal film indicates such a semiconductor film that although it is a semiconductor film formed of an aggregation of a plurality of crystal grains, it has such crystallinity that plane orientations of the respective crystal grains are uniform, that is, specific orientation is shown on the whole film surface.

Besides, the noncrystal-containing semiconductor film includes any semiconductor films containing amorphous components, and indicates a microcrystal semiconductor film, an amorphous semiconductor film, and a semiconductor film of an amorphous semiconductor film only a part of which is crystallized.

Besides, in the present specification, although a silicon film is cited as a typical example of the semiconductor film, it is needless to say that a semiconductor film such as a germanium film or a silicon germanium film (expressed by $Si_{1-x}Ge_x$ (0<X<1)) can also be used in the present invention.

Besides, in the third step of carrying out the laser annealing treatment, it is appropriate that excimer laser light using an excitation gas such as KrF (wavelength 248 nm), XeCl (wavelength 308 nm), or ArF (wavelength 193 nm) is used. The beam shape of the laser light may be a linear shape or a planar shape.

Besides, light energy which can be used in the present invention is not limited to the excimer laser light, but ultraviolet light or infrared light may be used. In that case, intense light with light intensity comparable to laser light has only to be radiated from an ultraviolet lamp or an infrared lamp.

In the fourth step, although a treatment atmosphere in the furnace annealing treatment is not particularly limited, it is preferable to use a reduced atmosphere. The reduced atmosphere indicates a hydrogen atmosphere, an ammonia atmosphere, or an inert gas atmosphere containing hydrogen or ammonia (mixed atmosphere of hydrogen and nitrogen, mixed atmosphere of hydrogen and argon, and the like). Besides, it is preferable that a treatment temperature is made 900 to 1200° C. (preferably 1000 to 1100° C.).

This step first has an effect to flatten the surface of the crystal-containing semiconductor film. This is a result of enhanced surface diffusion of semiconductor atoms functioning to make the surface energy minimum. Besides, at the same time, this step has also an effect to greatly decrease defects existing in crystal grains and crystal grain boundaries. This effect is obtained through a terminating effect to uncombined bonds by hydrogen, a removing effect to impurities by hydrogen, and recombination of semiconductor atoms with the effect. For the purpose of obtaining these effects, the heat treatment at 900 to 1200° C. in the reduced atmosphere is necessary.

Incidentally, flattening of the surface of the crystal-containing semiconductor film can be made in even an inert gas atmosphere (nitrogen atmosphere, helium atmosphere, or argon atmosphere). However, if reduction of a natural oxidation film is carried out by using a reducing function, a number of silicon atoms with high energy are produced and the flattening effect is consequently raised, so that the reduced atmosphere is preferable.

According to another aspect of the present invention, a method of manufacturing a semiconductor device is characterized by comprising:

a first step of forming a crystal-containing semiconductor film;

a second step of carrying out a laser annealing treatment with an energy density of 250 to 5000 mJ/cm$^2$ to the crystal-containing semiconductor film;

a third step of carrying out a furnace annealing treatment to the crystal-containing semiconductor film after the second step; and a fourth step of oxidizing the crystal-containing semiconductor film after the third step to decrease its thickness.

In the third step, although a treatment atmosphere in the furnace annealing treatment is not particularly limited, it is preferable to use a reduced atmosphere. The reduced atmosphere indicates a hydrogen atmosphere, an ammonia atmosphere, or an inert gas atmosphere containing hydrogen or ammonia (mixed atmosphere of hydrogen and nitrogen, mixed atmosphere of hydrogen and argon, and the like). Besides, it is preferable that a treatment temperature is made 900 to 1200° C. (preferably 1000 to 1100° C.).

This third step has an effect to further flatten the surface of the crystal-containing semiconductor film. This is a result of enhanced surface diffusion of semiconductor atoms functioning to make the surface energy minimum. Besides, at the same time, this step has also an effect to greatly decrease defects existing in crystal grains and crystal grain boundaries. This effect is obtained through a terminating effect to uncombined bonds by hydrogen, a removing effect to impurities by hydrogen, and recombination of semiconductor atoms with the effect. For the purpose of obtaining these effects, the heat treatment at 900 to 1200° C. in the reduced atmosphere is necessary.

In the fourth step, the step of oxidizing the film to decrease its thickness may be carried out through a plurality of thermal oxidation steps. As means for oxidizing the film to decrease its thickness, it is possible to use thermal oxidation, plasma oxidation, or the like. Particularly, in the present invention, oxidation through the thermal oxidation is preferable. Incidentally, in the case of the plasma oxidation, if He is added in an oxygen atmosphere, an oxygen radical is easily produced. Thus, the addition of He is preferable. Besides, in the fourth step, it is possible to obtain an effect to flatten the roughness of the surface of the semiconductor film.

According to another aspect of the present invention, a method of manufacturing a semiconductor device is characterized by comprising:

a first step of forming a crystal-containing semiconductor film;

a second step of carrying out a laser annealing treatment with an energy density of 250 to 5000 mJ/cm$^2$ to the crystal-containing semiconductor film;

a third step of carrying out a furnace annealing treatment at 900 to 1200° C. in a reduced atmosphere to the crystal-containing semiconductor film after the second step; and a fourth step of oxidizing the crystal-containing semiconductor film after the third step to decrease its thickness.

Further, according to another aspect of the present invention, a method of manufacturing a semiconductor device is characterized by comprising:

a first step of forming a crystal-containing semiconductor film;

a second step of carrying out a laser annealing treatment with an energy density of 250 to 5000 mJ/cm$^2$ to the crystal-containing semiconductor film;

a third step of oxidizing the crystal-containing semiconductor film after the second step to decrease its thickness; and a fourth step of carrying out a furnace annealing treatment to the crystal-containing semiconductor film after the third step.

Furthermore, according to another aspect of the present invention, a method of manufacturing a semiconductor device is characterized by comprising:

a first step of forming a crystal-containing semiconductor film;

a second step of carrying out a laser annealing treatment with an energy density of 250 to 5000 mJ/cm$^2$ to the crystal-containing semiconductor film;

a third step of oxidizing the crystal-containing semiconductor film after the second step to decrease its thickness; and a fourth step of carrying out a furnace annealing treatment at 900 to 1200° C. in a reduced atmosphere to the crystal-containing semiconductor film after the third step.

In the third step, the step of oxidizing the film to decrease its thickness may be carried out through a plurality of thermal oxidation steps. As means for oxidizing the film to decrease its thickness, it is possible to use thermal oxidation, plasma oxidation, or the like. Particularly, in the present invention, oxidation through the thermal oxidation is preferable. In the case of the plasma oxidation, if He is added in an oxygen atmosphere, an oxygen radical is easily produced. Thus, the addition of He is preferable. Besides, in the third step, it is possible to obtain an effect to flatten the roughness of the surface of the semiconductor film.

In the fourth step, although a treatment atmosphere in the furnace annealing treatment is not particularly limited, it is preferable to use a reduced atmosphere. The reduced atmosphere indicates a hydrogen atmosphere, an ammonia atmosphere, or an inert gas atmosphere containing hydrogen or ammonia (mixed atmosphere of hydrogen and nitrogen, mixed atmosphere of hydrogen and argon, and the like). Besides, it is preferable that the treatment temperature is made 900 to 1200° C. (preferably 1000 to 1100° C).

This fourth step has an effect to further flatten the surface of the crystal-containing semiconductor film. This is a result of enhanced surface diffusion of semiconductor atoms functioning to make the surface energy minimum. Besides, at the same time, this step has also an effect to greatly decrease defects existing in crystal grains and crystal grain boundaries. This effect is obtained through a terminating effect to uncombined bonds by hydrogen, a removing effect to impurities by hydrogen, and recombination of semiconductor atoms with the effect. For the purpose of obtaining these effects, the heat treatment at 900 to 1200° C. in the reduced atmosphere is necessary.

Incidentally, flattening of the surface of the crystal-containing semiconductor film can be made in even an inert gas atmosphere (nitrogen atmosphere, helium atmosphere, or argon atmosphere). However, if reduction of a natural oxidation film is carried out by using a reducing function, a number of silicon atoms with high energy are produced and the flattening effect is consequently raised, so that the reduced atmosphere is preferable.

Besides, in the first step of the above-described respective aspects, the crystal-containing semiconductor film includes any semiconductor films containing crystalline components, and specifically indicates a single crystal semiconductor film, a polycrystal semiconductor film, a microcrystal semiconductor film, a semiconductor film of an amorphous semiconductor film only a part of which is crystallized, and a semiconductor film substantially regarded as a single crystal film.

Incidentally, the semiconductor film substantially regarded as the single crystal film indicates such a semiconductor film that although it is a semiconductor film formed of an aggregation of a plurality of crystal grains, it has such crystallinity that plane orientations of the respective crystal grains are uniform, that is, specific orientation is shown on the whole film surface.

Besides, the noncrystal-containing semiconductor film includes any semiconductor films containing amorphous components, and indicates a microcrystal semiconductor film, an amorphous semiconductor film, and a semiconductor film of an amorphous semiconductor film only a part of which is crystallized.

Besides, in the present specification, although a silicon film is cited as a typical example of the semiconductor film, it is needless to say that a semiconductor film such as a germanium film or a silicon germanium film (expressed by $Si_{1-x}Ge_x$ (0<X<1)) can also be used in the present invention.

Besides, in the second step of the above-described respective aspects, it is appropriate that excimer laser light using an excitation gas such as KrF (wavelength 248 nm), XeCl (wavelength 308 nm), or ArF (wavelength 193 nm) is used in the step of carrying out the laser annealing treatment. The beam shape of the laser light may be a linear shape or a planar shape.

Besides, light energy which can be used in the present invention is not limited to the excimer laser light, but ultraviolet light or infrared light may be used. In that case, intense light with light intensity comparable to laser light has only to be radiated from an ultraviolet lamp or an infrared lamp.

DETAILED DESCRIPTION OF THE PREFERRED EMBODIMENTS

Preferred embodiments of the present invention will be described below in detail.

[Embodiment 1]

In this embodiment, steps of manufacturing a TFT over a substrate by carrying out the present invention will be described. FIGS. 1A to 1E will be used for the description.

First, a quartz substrate 101 was prepared. A material having high heat resistance must be selected as the substrate. Instead of the quartz substrate, a substrate of a material having high heat resistance, such as a silicon substrate, a ceramic substrate, a crystallized glass substrate, or a metal substrate may be used.

However, although an underlying film may not be provided in the case where the quartz substrate is used, it is preferable to provide an insulating film as the underlying film in the case where other materials are used. As the insulating film, it is appropriate that either one of a silicon oxide film (SiOx), a silicon nitride film (SixNy), a silicon oxynitride film (SiOxNy), and an aluminum nitride film (AlxNy), or a laminated film of those is used.

Besides, it is effective to use an under film of a laminate of a refractory metal layer and a silicon oxide film since a heat radiation effect is greatly increased. Even the laminate structure of the foregoing aluminum nitride film and the silicon oxide film exhibits a satisfactory heat radiation effect.

Figure 1A:
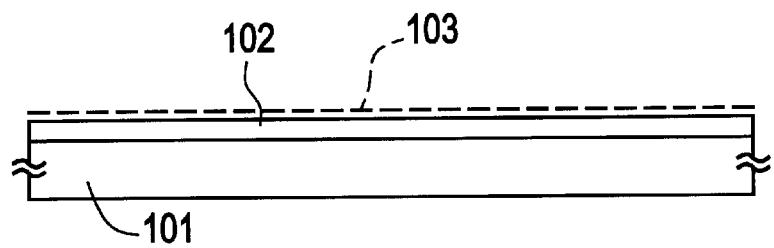
FIGS. 1A to 1E are views showing manufacturing steps of a thin film transistor.

After the quartz substrate 101 was prepared in this way, a semiconductor film (in this embodiment, amorphous silicon film) 102 with a thickness of 90 nm was formed, and a nickel-containing layer 103 was formed thereon. A method of forming the nickel-containing layer 103 may be referred to a technique disclosed in Japanese Patent Application Laid-open No. 7-130652, which in turn corresponds to a U.S. Pat. No. 5,643,826. An entire disclosure of the Japanese Patent Application No. 7-130652 and the U.S. Pat. No. 5,643,826 is incorporated herein by reference. (FIG. 1A)

Incidentally, in this embodiment, although an example of adding nickel by using the technique disclosed in Japanese Patent Application Laid-open No. 7-130652 will be described, it is also permissible to use a method of forming a nickel film and thermally diffusing nickel or a method of ion implantation (ion implantation method (with mass separation), plasma doping method (without mass separation), laser doping method, or the like).

In this embodiment, disilane ($Si_2H_6$) was used as a film forming gas of the amorphous silicon film 102, and the film was formed by a low pressure CVD method at 450° C. At this time, it is important to thoroughly control the concentration of impurities, such as C (carbon), N (nitrogen), and O (oxygen) mixed in the film. This is because if the amount of these impurities is high, the progress of crystallization is prevented.

The present applicant controlled the impurity concentration so that the concentration of carbon and nitrogen became $5\times10^{18}$ atoms/$cm^3$ or less (preferably $5\times10^{17}$ atoms/$cm^3$ or less), the concentration of oxygen became $1\times10^{19}$ atoms/$cm^3$ or less (preferably $5\times10^{18}$ atoms/$cm^3$ or less). Further, control was made so that the concentration of metal elements became $1\times10^{17}$ atoms/$cm^3$ or less. When such control of concentration has been made at a film formation stage, if only external pollution is prevented, impurity concentration is not increased during the steps of manufacturing the TFT.

Concerning the nickel-containing layer 103, a nickel acetate salt solution containing nickel of 10 ppm in terms of weight was applied to the whole surface (all region) of the amorphous silicon film 102 by a spin coating method, and dehydrogenating at about 450° C. for 1 hour was carried out.

Figure 1B:

Thereafter, a heat treatment at a temperature of 500 to 700° C. (typically 550 to 650° C.) for 4 to 24 hours was carried out in an inert gas atmosphere, a hydrogen atmosphere, or an oxygen atmosphere, so that a polysilicon film 104 was obtained. Nickel with a concentration of $1\times10^{18}$ to $1\times10^{19}$ atoms/$cm^3$ remains in this polysilicon film 104. (FIG. 1B)

Strictly speaking, nickel was not added in the amorphous silicon film at the point of time when the spin coating was carried out. However, in the subsequent dehydrogenating step, since nickel is easily diffused in the amorphous silicon film, it is permissible to regard the step as substantially an adding step.

Besides, if film quality comparable to the amorphous silicon film formed by the low pressure CVD method can be obtained, a plasma CVD method may be used. Besides, it is not necessary to form a completely amorphous semiconductor, but a microcrystal silicon film or the like may be formed.

Besides, instead of the amorphous silicon film, a semiconductor film such as a film of silicon germanium (expressed by $Si_xGe_{1-x}$ (0<X<1)) in which germanium is contained in a silicon film may be used. In that case, it is desirable that germanium contained in silicon germanium is made 5 atomic % or less.

Other than nickel, one kind or plural kinds of elements selected from lattice interstitial elements such as cobalt (Co), iron (Fe), palladium (Pd), platinum (Pt), copper (Cu), and gold (Au), or lattice substitutional (or melted type) elements such as germanium (Ge), lead (Pb), and tin (Sn) may be used.

Figure 10A:
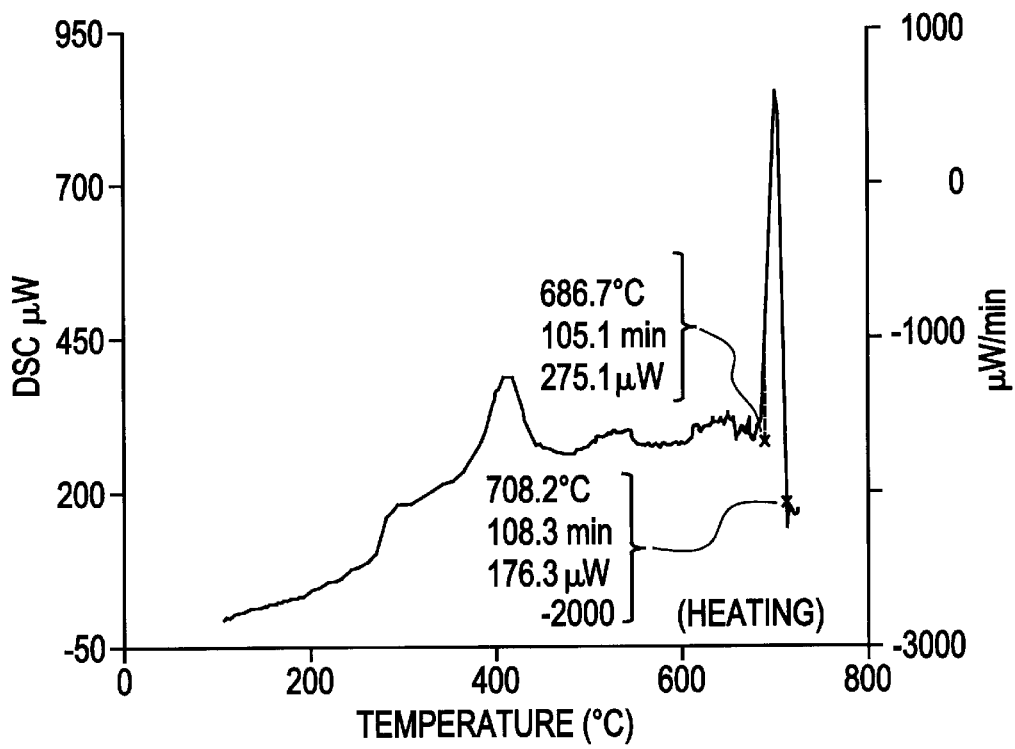
FIGS. 10A and 10B are views showing results of differential scanning calorimetry.
Figure 10B:
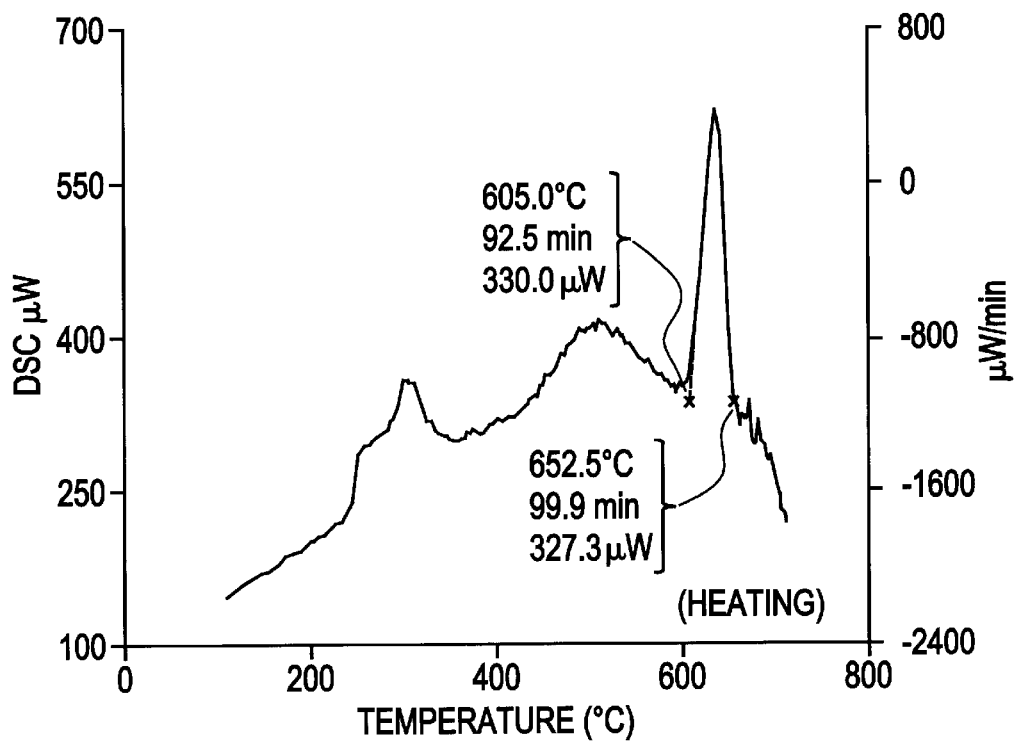

Here, FIGS. 10A and 10B show the results obtained by examining temperature at which an amorphous silicon film is transformed into a polysilicon film, by means of a differential scanning calorimetry (also called DSC).

As the result of analysis of phase change from the amorphous silicon film (film thickness: 500 nm) to the polysilicon film carried out by the present applicant using the differential scanning calorimetry, as shown by an arrow in FIG. 10A, it was ascertained that the phase change occurred at 686.7° C. However, the result shown in FIG. 10A shows data in the case where crystallization was made without using an element for promoting crystallization of an amorphous silicon film.

On the other hand, FIG. 10B shows the state of phase change in the case where nickel as the element for promoting crystallization of the amorphous silicon film is used as in this embodiment. At this time, the addition amount of nickel is 1 to $2\times10^{19}$ atoms/$cm^3$. In that case, it was ascertained that the temperature at which the phase change (crystallization) occurred was lowered and became 605.0° C.

Similar experiments were carried out also for the cases of using elements other than nickel to make confirmation, and it was ascertained that the phase change occurred at about 600° C. (550 to 650° C.) and crystallization was made in all the cases. The reason why the crystallization step is carried out in the foregoing temperature range by the present applicant is supported by such data.

After the state of FIG. 1B was obtained in this way, a furnace annealing treatment (heat treatment using an electrothermal furnace) at 1000° C. for 30 minutes was carried out in an oxidizing atmosphere. At this time, the thickness of the polysilicon film 104 was decreased (thinning treatment) by the thermal oxidation treatment, so that a polysilicon film 105 thinner than the polysilicon film 104 was formed. (FIG. 1C)

Figure 1C:

Incidentally, although not shown in FIG. 1C, a thermal oxidation film is formed on the polysilicon film 105. This thermal oxidation film may be removed, or may be actively used as a protection film in a subsequent laser annealing step.

In this thermal oxidation step, defects or the like in the polysilicon film were repaired by surplus silicon atoms produced when the oxidizing reaction proceeds, so that it was possible to obtain the polysilicon film with very few defects. Since the thickness of the polysilicon film was decreased, an initial thickness of 90 nm was changed to 60 nm.

Moreover, since the oxidizing reaction progressed while scraping the surface layer of the polysilicon film, the formed polysilicon film 105 became a semiconductor film with a very flat surface. This effectively serves to decrease levels in an interface between an active layer and a gate insulating film of a TFT.

Incidentally, when this thinning step is repeated plural times, the flatness of the polysilicon film is further improved. In that case, the thermal oxidation step and the removing step of the thermal oxidation film are alternately repeated.

In this embodiment, since the amorphous silicon film with a thickness of 90 nm is used as an initial film, the thinning step is adopted. However, if the thickness of the initial film is made 50 nm or less to eliminate the necessity of thinning the film more, the thinning step can also be omitted.

Figure 1D:

After the state of FIG. 1C was obtained in this way, the polysilicon film 105 was next irradiated with excimer laser light. In this embodiment, the laser annealing treatment was carried out with pulse oscillation excimer laser light using XeCl (wavelength: 308 nm) as an excitation gas. Although the beam shape of the excimer laser may be a linear beam, in order to increase the uniformity of the treatment, a planar beam may also be used. (FIG. 1D)

Incidentally, excimer laser light using KrF, KrCl, ArF, or the like as an excitation gas, or another ultraviolet laser may be used. In the case where infrared light is used, the polysilicon film 105 has only to be irradiated with intense light emitted from an infrared lamp.

In this embodiment, linear laser light having an oscillation frequency of 30 Hz and a beam shape of 145×0.41 mm was used. Besides, the substrate was scanned with the laser light at 1.2 mm/sec from one end of the substrate to the other end, and an overlap of adjacent linear laser light was made 92%.

Besides, in the case of this embodiment, it is preferable to carry out the laser annealing treatment under the condition that the laser energy density is 250 to 5000 mJ/cm$^2$ (preferably 450 to 1000 mJ/cm$^2$). In this embodiment, the laser energy density was made 550 mJ/cm$^2$. Here, a method of measuring the laser energy density in the present specification will be explained.

First, light intensity ($E_0$) of laser light oscillated from a laser oscillator is measured by a power meter. However, the laser light after having passed through the power meter is attenuated in accordance with the transmittance (a) of an attenuator, and is further attenuated in accordance with the transmittance (b) of an optical system. Laser energy density (E) is obtained by dividing the light intensity of the laser light attenuated in this way by a laser irradiation area (A). This is expressed by an expression of $E=(E_0 \times a \times b)/A$.

Figure 1E:
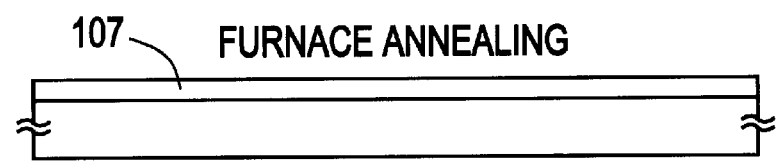

Next, a furnace annealing treatment at 1000° C. for 2 hours was carried out to a polysilicon film 106 obtained by carrying out this laser annealing step. In this embodiment, although the treatment atmosphere is made a hydrogen atmosphere, there is no problem as long as a reduced atmosphere is used. Even if an inert gas atmosphere such as a nitrogen atmosphere is used, an object of improving the crystallinity can be achieved. (FIG. 1E)

Incidentally, it is desirable to wash the surface of the polysilicon film 106 by a hydrofluoric acid based etchant before this furnace annealing step is carried out. That is, such contrivance is effective that a natural oxidation film is removed and silicon atoms on the surface are terminated with hydrogen to prevent a natural oxidation film from being formed before an actual treatment.

However, attention must be paid especially to the point that the concentration of oxygen or an oxygen compound (for example, OH group) contained in the atmosphere is made 10 ppm or less (preferably 1 ppm or less). Otherwise, the flattening effect by the heat treatment in the reduced atmosphere is weakened.

In this way, a polysilicon film 107 was obtained. The polysilicon film 107 had a very flat surface by hydrogen annealing at a high temperature such as 1000° C. Besides, since the annealing was carried out at a high temperature, stacking fault and the like hardly existed in crystal grains.

As a result of observation by a Raman measurement method for the polysilicon film obtained by the present applicant through the steps of this embodiment, a Raman peak value was 517 to 520 cm$^{-1}$ (typically 518 to 519 cm$^{-1}$). Besides, a half width at half maximum was 2.2 to 3.0 cm$^{-1}$ (typically 2.4 to 2.6 cm$^{-1}$).

The Raman peak value of 518 to 519 cm$^{-1}$ is positioned at a very high wavenumber side, and it is understood that the polysilicon film obtained in this embodiment includes a crystal very close to a single crystal. Besides, the value of 2.4 to 2.6 cm$^{-1}$ is also very small (a single crystal silicon film measured as reference was 2.1 cm$^{-1}$), and this means that crystallinity is high.

Incidentally, in the present specification, the Raman peak value is a peak value obtained when fitting with a Lorentz distribution is carried out to a Raman spectrum obtained when-a crystal-containing semiconductor film (in this embodiment, polysilicon film) is irradiated with Ar laser light having a wavelength of 514.5 nm and a light intensity of $1.0 \times 10^5$ to $1.3 \times 10^5$ W/cm$^2$. In the actual measurement, "RAMASCOPE MICROSCOPIC RAMAN APPARATUS SYSTEM 2000" which is a microscope Raman measuring apparatus manufactured by RENISHAW Inc. was used.

The half width at half maximum is a value of half of a half width obtained when fitting with a Lorentz distribution is carried out to a Raman spectrum obtained when a crystal-containing semiconductor film is irradiated with Ar laser light having a wavelength of 514.5 nm and a light intensity of $1.0 \times 10^5$ to $1.3 \times 10^5$ W/cm$^2$. This value was also measured by the foregoing Raman measuring apparatus.

With respect to the Raman peak value and the half width at half maximum each having the foregoing definition, it was found that in the polysilicon film 107 of this embodiment, the ratio of the Raman peak value to the half width at half maximum (Raman peak value divided by half width at half maximum) was 170 to 240 (typically 190 to 220).

After the polysilicon film 107 with extremely high crystallinity was obtained in this way, this polysilicon film 107 was patterned so that an active layer 108 was formed. Incidentally, in this embodiment, although the heat treatment in the hydrogen atmosphere is carried out before the active layer is formed, the heat treatment may be carried out after the active layer is formed. That case is preferable since stress generated in the polysilicon film is relieved through the state that the film has been patterned.

Then a thermal oxidation step was carried out so that a silicon oxide film 109 with a thickness of 10 nm was formed on the surface of the active layer 108. This silicon oxide film 109 functions as a gate insulating film. Besides, since the film thickness of the active layer 108 was decreased through this oxidation by 5 nm, the thickness became 45 nm. In view of the film decrease by the thermal oxidation, it is necessary to determine the film thickness of the initial semiconductor film (semiconductor film formed at the first) so that an active layer (especially a channel formation region) with a thickness of 10 to 50 nm finally remains.

After the gate insulating film 109 was formed, a polysilicon film having conductivity was formed thereon and a gate wiring line 110 was formed by patterning. (FIG. 2A)

In this embodiment, although polysilicon having N-type conductivity is used for the gate wiring line, a material is not limited to this. Particularly, for the purpose of lowering the resistance of the gate wiring line, it is also effective to use tantalum, tantalum alloy, or a laminated film of tantalum and tantalum nitride. In order to obtain a gate wiring line of further low resistance, it is also effective to use copper or copper alloy.

Figure 2A:
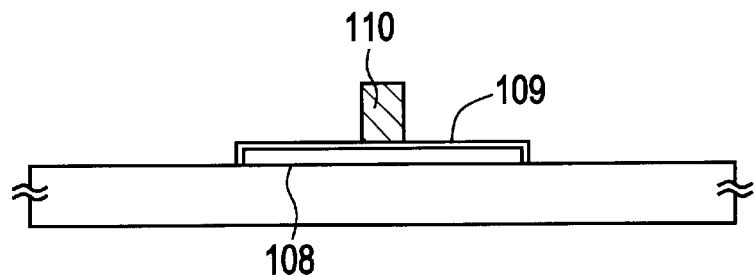
FIGS. 2A to 2D are views showing manufacturing steps of a thin film transistor.

After the state of FIG. 2A was obtained, an impurity to give N-type conductivity or P-type conductivity was added to form an impurity region 111. The impurity concentration at this time was determined in view of an impurity concentration of a subsequent LDD region. In this embodiment, although arsenic with a concentration of $1 \times 10^{18}$ atoms/cm$^3$ was added, it is not necessary to limit the impurity and the concentration to those of this embodiment.

Next, a thin silicon oxide film 112 with a thickness of about 5 to 10 nm was formed on the surface of the gate wiring line 110. It is appropriate that this film is formed by using a thermal oxidation method or a plasma oxidation method. This silicon oxide film 112 functions as an etching stopper in a subsequent side wall forming step.

Figure 2B:
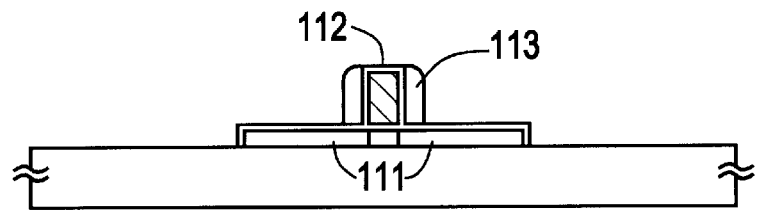

After the silicon oxide film 112 to become the etching stopper was formed, a silicon nitride film was formed and etch back was carried out, so that a side wall 113 was formed. In this way, the state of FIG. 2B was obtained.

Incidentally, in this embodiment, although the silicon nitride film was used as the side wall, it is also possible to use a polysilicon film or an amorphous silicon film. Of course, it is needless to say that if a material of the gate wiring line is changed, a material which can be used as the side wall is also changed according to that.

Figure 2C:
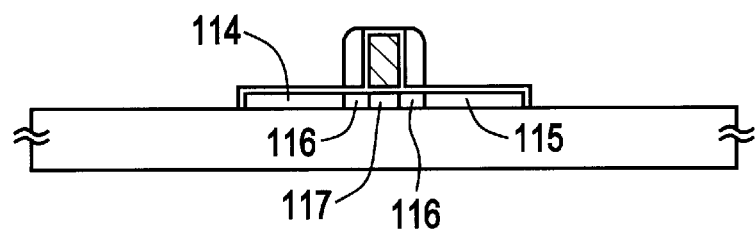

Next, an impurity with the same conductivity as that in the previous step was again added. The concentration of the impurity added at this time was made higher than that in the previous step. In this embodiment, although arsenic is used as an impurity and its concentration is made $1\times10^{21}$ atoms/cm$^3$, it is not necessary to make limitation to this. By the adding step of the impurity, a source region 114, a drain region 115, an LDD region 116, and a channel formation region 117 were defined. (FIG. 2C)

After the respective impurity regions were formed in this way, activation of the impurity was carried out by a heat treatment such as furnace annealing, laser annealing, or lamp annealing.

Figure 2D:
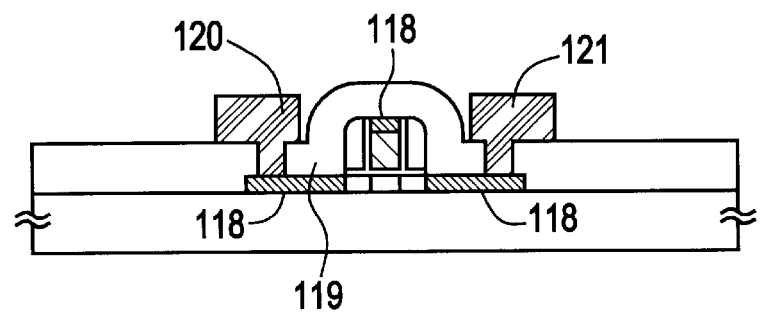

Next, silicon oxide films formed on the surfaces of the gate wiring line 110, the source region 114, and the drain region 115 were removed to expose the surfaces of those. Then a cobalt film (not shown) with a thickness of about 5 nm was formed and a heat treatment step was carried out. A reaction of cobalt and silicon occurred by this heat treatment, so that a silicide layer (cobalt silicide layer) 118 was formed. (FIG. 2D)

This technique is a well-known self-aligned silicide technique. Thus, instead of cobalt, titanium or tungsten may be used, and an annealing condition and the like may be determined by referring to a well-known technique. In this embodiment, a lamp annealing treatment step was carried out by irradiation of infrared light.

After the silicide layer 118 was formed in this way, the cobalt film was removed. Thereafter, an interlayer insulating film 119 with a thickness of 1 $\mu$m was formed. As the interlayer insulating film 119, it is appropriate that a silicon oxide film, a silicon nitride film, a silicon nitride oxide film, or a resin film (polyimide, acryl, polyamide, polyimide-amide, benzocyclobutene (BCB), etc.) is used. These insulating films may be laminated in a free combination.

Next, contact holes were formed in the interlayer insulating film 119, and a source wiring line 120 and a drain wiring line 121 made of a material containing aluminum as its main ingredient were formed. Finally, the whole component was subjected to furnace annealing at 300° C. for 2 hours in a hydrogen atmosphere, so that hydrogenating was completed.

A TFT as shown in FIG. 2D was obtained in this way. Incidentally, the structure explained in this embodiment is merely an example, and a TFT structure to which the present invention can be applied is not limited to this. The present invention can be applied to a TFT of any well-known structure.

Besides, it is not necessary to limit numerical value conditions in steps subsequent to formation of the polysilicon film 107 to those of this embodiment. Further, there is no problem even if a well-known channel doping step (impurity adding step for controlling a threshold voltage) is introduced to somewhere in this embodiment.

Besides, in this embodiment, since the concentration of impurities such as C, N, and O was thoroughly controlled at the stage of film formation of the amorphous silicon film as the initial film, the concentration of each impurity contained in the active layer of the completed TFT was such that the concentration of carbon and nitrogen remained to be $5\times10^{18}$ atoms/cm$^3$ or less (preferably $5\times10^{17}$ atoms/cm$^3$ or less), and the concentration of oxygen remained to be $1\times10^{19}$ atoms/cm$^3$ or less (preferably $5\times10^{18}$ atoms/cm$^3$ or less). The concentration of metal elements except nickel was $1\times10^{17}$ atoms/cm$^3$ or less.

Besides, it is needless to say that the present invention can be readily applied to not only a top gate structure but also to a bottom gate structure typified by an inverted staggered structure TFT.

Although the description has been made on the N-channel TFT as an example, it is also easy to manufacture a P-channel TFT through combination with a well-known technique. Further, through combination with a well-known technique, it is also possible to form a CMOS circuit by forming an N-channel TFT and a P-channel TFT on the same substrate and by complementarily combining them.

Further, in the structure of FIG. 2D, if a pixel electrode (not shown) electrically connected to the drain wiring line 121 is formed by a well-known means, it is also easy to form a pixel switching element of an active matrix type display device. That is, the present invention can also be carried out when an active matrix type electro-optical device such as a liquid crystal display device or an EL (electroluminescence) display device is manufactured.

[Embodiment 2]

In this embodiment, an example in which an initial film first formed on a substrate is made a polysilicon film, will be described with reference to FIGS. 3A to 3D.

Figure 3A:
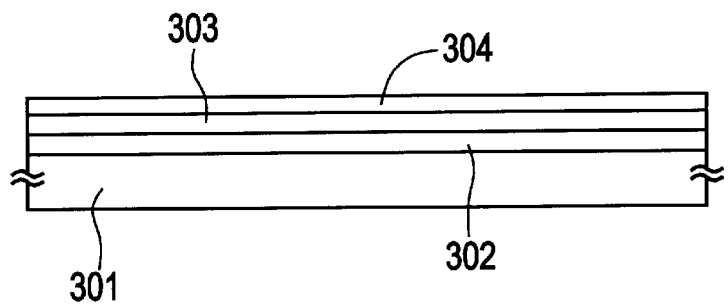
FIGS. 3A to 3D are views showing manufacturing steps of a thin film transistor.

First, an underlying film 302 made of a silicon oxide film, a polysilicon film 303 with a thickness of 75 nm, and a protection film 304 are continuously formed and laminated on a metal substrate (in this embodiment, tantalum substrate) 301 without making opening to the air. Incidentally, in this embodiment, film formation is carried out in a multichamber system low pressure CVD apparatus having a vacuum load-lock chamber and a common chamber. (FIG. 3A)

Figure 3B:
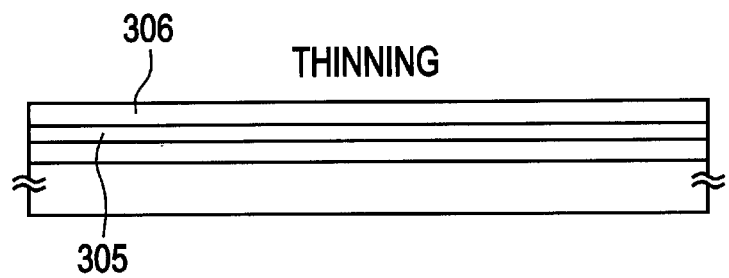

Next, a thermal oxidation step at 1050° C. for 30 minutes is carried out. In this embodiment, for the purpose of carrying out the heat treatment while relieving stress, a wet oxidation method containing water vapor was used. The thickness of a polysilicon film 305 obtained through this step is decreased through the oxidation to 50 nm. The thickness of the protection film 306 is increased by the thickness of the formed thermal oxidation film. (FIG. 3B)

Of course, this thermal oxidation step is carried out as a thinning step for further thinning the polysilicon film. When this thinning step is carried out plural times, the flatness of the polysilicon film is further improved. In that case, it is appropriate that the thermal oxidation step and the removing step of the thermal oxidation film are alternately repeated.

Next, a laser annealing step is carried out by KrF excimer laser light while the protection film 306 is made to remain. As a laser irradiation condition of this embodiment, linear laser light having an oscillation frequency of 30 Hz and a beam shape of 145×0.41 mm was used. Besides, the substrate was scanned with the laser light at 1.2 mm/sec from one end of the substrate to the other end, and an overlap of adjacent linear laser light was made 92%.

Figure 3C:
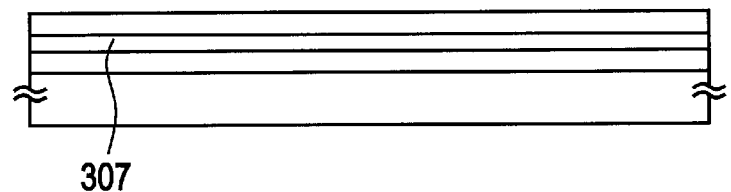
Figure 3D:
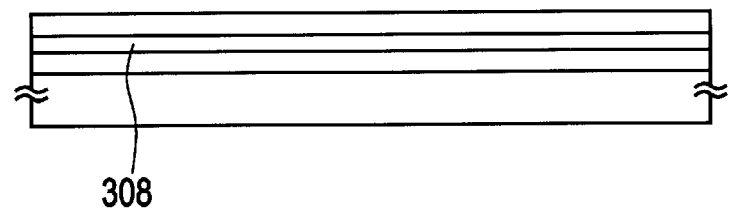

Besides, in the case of this embodiment, the laser annealing step is carried out under the condition that the laser energy density is 450 to 5000 mJ/cm$^2$ (preferably 500 to 1000 mJ/cm$^2$). In this embodiment, the laser energy density is made 600 mJ/cm$^2$. Incidentally, a method of measuring the laser energy density is the same as Embodiment 1. In this way, a polysilicon film 307 is formed. (FIG. 3C)

After the laser annealing step is completed in this way, a furnace annealing treatment at 1100° C. for 2 hours is carried out in a nitrogen atmosphere to improve the crystallinity of the polysilicon film 307. By this step, a polysilicon film 308 is obtained. The thus obtained polysilicon film 308 shows specific orientation on the whole film surface, and becomes a semiconductor film regarded as substantially a single crystal film.

Since the polysilicon film 308 formed in the manner described above is treated in all the steps of FIGS. 3A to 3D without being exposed to the outside air, this film has an extremely clean interface. This is an effect obtained by two structures that (1) the step of FIG. 3A is carried out in continuous film formation without making opening to the air, and (2) all the treatments are carried out through the protection film.

Besides, the Raman peak value and the half width at half maximum also fall within the range explained in Embodiment 1.

Incidentally, in this embodiment, although the polysilicon film is used as the initial film (semiconductor film formed at the first), it is also possible to first form a microcrystal silicon film or an amorphous silicon film and to crystallize the film through a protection film by a laser. Of course, a semiconductor material other than silicon may be used.

After the polysilicon film 308 is obtained in this way, it is satisfactorily if the TFT is manufactured in the same procedure as Embodiment 1. Of course, the TFT can be manufactured by not only the procedure of Embodiment 1 but also a well-known means.

[Embodiment 3]

In this embodiment, an example in which crystallization of an amorphous silicon film as an initial film is carried out by a technique disclosed in Japanese Patent Application Laid-open No. 8-78329, will be described with reference to FIGS. 4A to 4G. An entire disclosure of the Japanese Patent Application No. 8-78329 is incorporated herein by reference.

First, a quartz substrate 401 having a surface provided with an insulating film is prepared, and an amorphous silicon film (not shown) and a silicon oxide film (not shown) are continuously formed and laminated thereon without making opening to the air. Next, the silicon oxide film is patterned to form a mask 402 having an opening portion.

Next, a solution containing nickel of 100 ppm in terms of weight is applied by a spin coating method, so that such a state that the amorphous silicon film is in contact with nickel is obtained at the bottom of the opening portion. Thereafter, a furnace annealing step at 570° C. for 14 hours is carried out to obtain a lateral growth region 403.

In the lateral growth region 403, since rod-like crystals grow in a direction almost parallel to the substrate, the number of defects and trap levels are small as compared with a polysilicon film in which nucleus generation occurs at random.

Figure 4A:
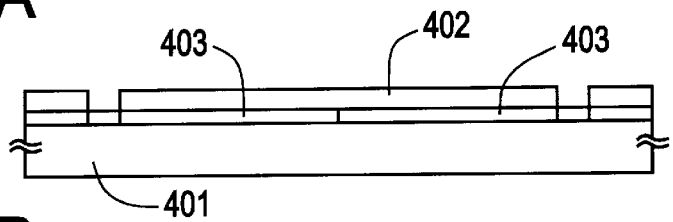
FIGS. 4A to 4G are views showing manufacturing steps of a thin film transistor.

In the state of FIG. 4A, there is obtained a semiconductor film in which a region remaining as an amorphous component and the lateral growth region (region containing crystal components) are mixed to each other. In the present specification, such a film is also called a semiconductor film (or crystal-containing semiconductor film).

After the state of FIG. 4A is obtained in this way, the mask 402 is kept using as a mask and phosphorus is added by a plasma doping method or an ion implantation method. The addition amount of phosphorus is adjusted so that its concentration in the silicon film becomes $1\times10^{19}$ to $1\times10^{21}$ atoms/cm$^3$ in the secondary ion mass spectroscopy (SIMS).

Figure 4B:
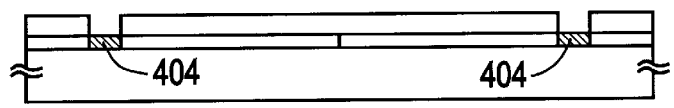

The region in which phosphorus with a high concentration is added in this way is called a gettering region 404 in the present specification. (FIG. 4B)

Figure 4C:
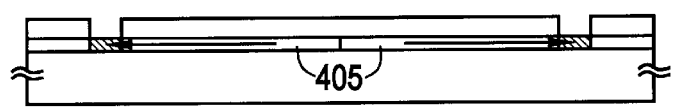

After the gettering region 404 is formed, a furnace annealing step at 600° C. for 12 hours is carried out, so that nickel existing in the lateral growth region 403 is made to be gettered into the gettering region 404. In this way, a lateral growth region 405 in which nickel concentration in the film is lowered to $1\times10^{17}$ atoms/cm$^3$ is obtained. (FIG. 4C)

Next, patterning is carried out so that an island-like semiconductor film 406 formed of only the lateral growth region 405 is obtained. At this time, since the gettering region contains phosphorus and nickel with a high concentration, it is desirable to completely remove the region.

Figure 4D:
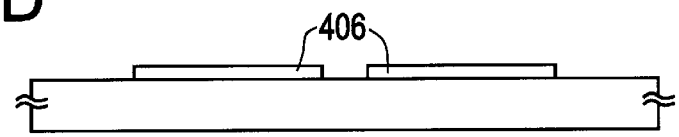
Figure 4E:
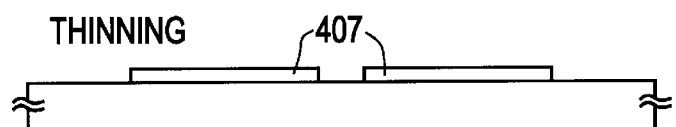

In this way, the state of FIG. 4D is obtained. Next, a furnace annealing treatment at 1000° C. for 30 minutes is carried out in an oxygen atmosphere, so that a thermal oxidation step (thinning step) is carried out. A thermal oxidation film (not shown) formed at this time may be removed here, or may be made to remain until a next laser annealing treatment is carried out. (FIG. 4E)

Figure 4F:
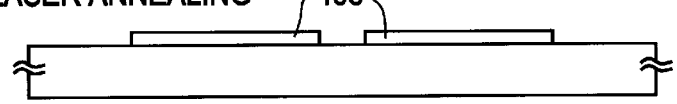

After an island-like semiconductor film 407 in which its thickness is decreased by the thinning step, is obtained in this way, a laser annealing treatment is next carried out by using XeCl excimer laser light. The laser irradiation condition in this embodiment is made the same as Embodiment 1. (FIG. 4F)

Figure 4G:

After an island-like semiconductor film 408 through the laser annealing step is obtained in this way, a furnace annealing treatment at 1100° C. for 2 hours is further carried out in an atmosphere in which hydrogen and nitrogen are mixed. In this way, an island-like semiconductor film 409 is obtained. (FIG. 4G)

The island-like semiconductor film 409 formed in the manner described above has crystallinity comparable to the polysilicon film explained in Embodiment 1 and Embodiment 2. That is, the whole film surface shows specific orientation, and the film has become a semiconductor film which can be regarded as substantially a single crystal film.

Besides, the Raman peak value and the half width at half maximum obtained through the Raman measurement also become the same as those explained in Embodiment 1.

[Embodiment 4]

In Embodiment 1 or embodiment 3, an element (specifically nickel) for promoting crystallization is used at crystallization of an initial film. However, even if the steps of the present invention are applied to a polysilicon film (this is also a crystal-containing semiconductor film) crystallized through natural nucleus generation, a satisfactory effect can be obtained.

In that case, an underlying film, an amorphous silicon film, and a protection film are continuously formed and laminated without making opening to the air, and the amorphous silicon film is crystallized into a polysilicon film by a furnace annealing treatment at 600° C. for 24 hours, so that the polysilicon film with a clean interface can be obtained.

However, in the case where crystallization of a semiconductor film is carried out with natural nucleus generation as in this embodiment, it is desirable that the film has a thickness of 80 to 120 nm (typically 90 to 100 nm). That is, it is empirically known that if an initial film is thin from the beginning, efficiency of crystallization is lowered.

In such a case, it is important to carry out thinning (to decrease the film thickness) of the crystal-containing semiconductor film by adding an oxidation step after completion of crystallization. By doing so, crystallization is effectively carried out, and thereafter, a polysilicon film with a desired thickness can be obtained.

Incidentally, the structure of this embodiment can be combined with any of the structures of Embodiment 1 and Embodiment 3.

[Embodiment 5]

In this embodiment, steps of manufacturing a TFT on a substrate by carrying out the present invention will be described. FIGS. 5A to 5E are used for the description.

First, a quartz substrate 1101 was prepared. A material having high heat resistance must be selected as the substrate.

Instead of the quartz substrate, a substrate of a material having high heat resistance, such as a silicon substrate, a ceramic substrate, a crystallized glass substrate, or a metal substrate may be used.

However, although an under film may not be provided in the case where the quartz substrate is used, it is preferable to provide an insulating film as the under film in the case where other materials are used. As an insulating film, it is appropriate that either one of a silicon oxide film (SiOx), a silicon nitride film (SixNy), a silicon oxynitride film (SiOxNy), and an aluminum nitride film (AlxNy), or a laminated film of those is used.

Besides, it is effective to use an underlying film of a laminate of a refractory metal layer and a silicon oxide film since a heat radiation effect is greatly increased. Even the laminate structure of the foregoing aluminum nitride film and the silicon oxide film exhibits a sufficient heat radiation effect.

Figure 5A:
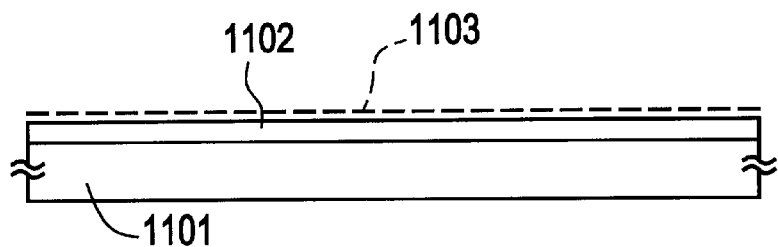
FIGS. 5A to 5E are views showing manufacturing steps of a thin film transistor.

After the quartz substrate 1101 was prepared in this way, a semiconductor film (in this embodiment, amorphous silicon film) 1102 with a thickness of 90 nm was formed, and a nickel-containing layer 1103 was formed thereon. A method of forming the nickel-containing layer 1103 may be referred to a technique disclosed in the Japanese Patent Application Laid-open No. 7-130652. (FIG. 5A)

Incidentally, in this embodiment, although an example of adding nickel by using a technique disclosed in Japanese Patent Application Laid-open No. 7-130652 will be described, it is also possible to use a method of forming a nickel film and thermally diffusing nickel or a method of ion implantation (ion implantation method (with mass separation), plasma doping method (without mass separation), laser doping method, or the like).

In this embodiment, disilane ($Si_2H_6$) was used as a film forming gas of the amorphous silicon film 1102, and film formation was made by a low pressure CVD method at 450° C. At this time, it is important to thoroughly control the concentration of impurities, such as C (carbon), N (nitrogen), and O (oxygen) mixed in the film. This is because if the amount of these impurities is high, the progress of crystallization is blocked.

The present applicant controlled the impurity concentration so that the concentration of carbon and nitrogen became $5\times10^{18}$ atoms/cm$^3$ or less (preferably $5\times10^{17}$ atoms/cm$^3$ or less), the concentration of oxygen became $1\times10^{19}$ atoms/cm$^3$ or less (preferably $5\times10^{18}$ atoms/cm$^3$ or less). Further, control was made so that the concentration of metal elements became $1\times10^{17}$ atoms/cm$^3$ or less. When such control of concentration has been made at a film formation stage, if only external pollution is prevented, impurity concentration is not increased during the steps of manufacturing the TFT.

Concerning the nickel-containing layer 1103, a nickel acetate salt solution containing nickel of 10 ppm in terms of weight was applied to the whole surface (all region) of the amorphous silicon film 1102 by a spin coating method, and dehydrogenating at about 450° C. for 1 hour was carried out.

Figure 5B:
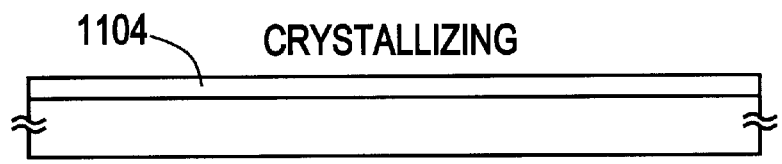

Thereafter, a heat treatment at a temperature of 500 to 700° C. (typically 550 to 650° C.) for 4 to 24 hours was carried out in an inert gas atmosphere, a hydrogen atmosphere, or an oxygen atmosphere, so that a polysilicon film 1104 was obtained. Nickel with a concentration of $1\times10^{18}$ to $1\times10^{19}$ atoms/cm$^3$ remains in this polysilicon film 1104. (FIG. 5B)

Strictly speaking, nickel is not added in the amorphous silicon film at the point of time when the spin coating is carried out. However, in the subsequent dehydrogenating step, since nickel is easily diffused in the amorphous silicon film, it is permissible to regard the step as substantially an adding step.

Incidentally, if film quality comparable to the amorphous silicon film formed by the low pressure CVD method is obtained, a plasma CVD method may be used. Besides, it is not necessary to form a completely amorphous semiconductor, but a microcrystal silicon film or the like may be formed.

Besides, instead of the silicon film, a semiconductor film such as a film of silicon germanium (expressed by $Si_xGe_{1-x}$ ($0<X<1$)) in which germanium is contained in a silicon film may be used. In that case, it is desirable that germanium contained in silicon germanium is made 5 atomic % or less.

Other than nickel, one kind or plural kinds of elements selected from lattice interstitial elements such as cobalt (Co), iron (Fe), palladium (Pd), platinum (Pt), copper (Cu), and gold (Au), or lattice substitutional (or melted type) elements such as germanium (Ge), lead (Pb), and tin (Sn) may be used.

Here, FIGS. 10A and 10B show the results obtained by examining temperature at which an amorphous silicon film is transformed into a polysilicon film, by means of a differential scanning calorimetry (also called DSC).

As the result of analysis of phase change from the amorphous silicon film (film thickness: 500 nm) to the polysilicon film carried out by the present applicant using the differential thermal analysis method, as shown by an arrow in FIG. 10A, it was ascertained that the phase change occurred at 686.7° C. However, the result shown in FIG. 10A shows data in the case where crystallization was made without using an element for promoting crystallization of an amorphous silicon film.

On the other hand, FIG. 10B shows the state of phase change in the case where nickel as the element for promoting crystallization of the amorphous silicon film is used as in this embodiment. At this time, the addition amount of nickel is 1 to $2\times10^{19}$ atoms/cm$^3$. In that case, it was ascertained that the temperature of the occurrence of the phase change (crystallization) was lowered and became 605.0° C.

Similar experiments were carried out for the case of using elements other than nickel to make confirmation, and it was ascertained that the phase change occurred at about 600° C. (550 to 650° C.) in all the elements and crystallization was made. The reason why the crystallization step is carried out in the foregoing temperature range by the present applicant is supported by such data.

Figure 5C:

After the state of FIG. 5B was obtained in this way, the polysilicon film 1104 was next irradiated with excimer laser light. In this embodiment, the laser annealing treatment was carried out with pulse oscillation excimer laser light using XeCl (wavelength: 308 nm) as an excitation gas. Although the beam shape of the excimer laser may be a linear beam, in order to increase the uniformity of the treatment, a planar beam may be used. (FIG. 5C)

Incidentally, excimer laser light using KrF, KrCl, ArF, or the like as an excitation gas, or another ultraviolet laser may be used. In the case where infrared light is used, the polysilicon film 1104 has only to be irradiated with intense light emitted from an infrared lamp.

In this embodiment, linear laser light having an oscillation frequency of 30 Hz and a beam shape of 145×0.41 mm was used. Besides, the substrate was scanned with the laser light at 1.2 mm/sec from one end of the substrate to the other end, and an overlap of adjacent linear laser light was made 92%.

Besides, in the case of this embodiment, it is preferable to carry out the laser annealing treatment under the interface between an active layer and a gate insulating film of a TFT.

Incidentally, when this thinning step is repeated plural times, the flatness of the polysilicon film is further improved. In that case, the thermal oxidation step and the removing step of the thermal oxidation film are alternately repeated.

Incidentally, in this embodiment, since the amorphous silicon film with a thickness of 90 nm is used as an initial film, the thinning step is adopted. However, if the thickness of the initial film is made 50 nm or less to eliminate the necessity of thinning more, the thinning step can also be omitted.

Next, a furnace annealing treatment at 1000° C. for 2 hours was carried out to the polysilicon film 1106 obtained by carrying out this thinning step. In this embodiment, although the treatment atmosphere is made a hydrogen atmosphere, there is no problem as long as a reduced atmosphere is used. Even if an inert gas atmosphere such as a nitrogen atmosphere is used, an object of improving the crystallinity can be achieved. (FIG. 5E)

Incidentally, it is desirable to wash the surface of the polysilicon film 1106 by a hydrofluoric acid based etchant before this furnace annealing step is carried out. That is, such contrivance is effective that a natural oxidation film is removed and silicon atoms on the surface are made to be terminated with hydrogen to prevent a natural oxidation film from being formed before an actual treatment.

However, attention must be paid especially to the point that the concentration of oxygen or an oxygen compound (for example, OH group) contained in the atmosphere is made 10 ppm or less (preferably 1 ppm or less). Otherwise, the flattening effect by the heat treatment in the reduced atmosphere is weakened.

In this way, a polysilicon film 1107 was obtained. The polysilicon film 1107 had a very flat surface by the hydrogen annealing at a high temperature such as 1000° C. Besides, since condition that the laser energy density is 250 to 5000 mJ/cm$^2$ (preferably 450 to 1000 mJ/cm$^2$). In this embodiment, the laser energy density was made 550 mJ/cm$^2$. Here, a method of measuring the laser energy density in the present specification will be explained.

First, light intensity ($E_0$) of laser light oscillated from a laser oscillator is measured by a power meter. However, the laser light after having passed through the power meter is attenuated in accordance with transmittance (a) of an attenuator, and is further attenuated in accordance with transmittance (b) of an optical system. Laser energy density (E) is obtained by dividing the light intensity of the laser light attenuated in this way by a laser irradiation area (A). This is expressed by an expression of $E=(E_0 \times a \times b)/A$.

After the state of FIG. 5C was obtained in this way, a furnace annealing treatment (heat treatment using an electrothermal furnace) at 1000° C for 30 minutes was carried out in an oxidizing atmosphere. At this time, the film thickness of the polysilicon film 1105 was decreased (thinning treatment) by the thermal oxidation treatment, so that a polysilicon film 1106 thinner than the polysilicon film 1105 was formed. (FIG. 5D)

Figure 5D:
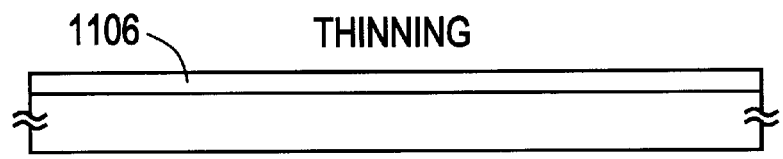
Figure 5E:

Incidentally, although not shown in FIG. 5D, a thermal oxidation film is formed on the polysilicon film 1105. This thermal oxidation film may be removed, or may be actively used as a protection film in a subsequent laser annealing step.

In this thermal oxidation step, defects or the like in the polysilicon film are repaired by surplus silicon atoms produced when the oxidizing reaction proceeds, so that it was possible to obtain the polysilicon film with very few defects. Besides, the thickness of the polysilicon film was decreased, so that the initial thickness of 90 nm was changed to 60 nm.

Moreover, since the oxidizing reaction progressed while scraping the surface layer of the polysilicon film, the formed polysilicon film 1106 became a semiconductor film with a very flat surface. This effectively serves to decrease levels in an the annealing was carried out at a high temperature, stacking fault and the like hardly existed in the crystal grains.

As a result of observation through a Raman measurement method for the polysilicon film obtained by the present applicant through the steps of this embodiment, the Raman peak value was 517 to 520 cm$^{-1}$ (typically 518 to 519 cm$^{-1}$). Besides, the half width at half maximum was 2.2 to 3.0 cm$^{-1}$ (typically 2.4 to 2.6 cm$^{-1}$).

The Raman peak value of 518 to 519 cm$^{-1}$ is positioned at a very high wavenumber side, and it is understood that the polysilicon film obtained in this embodiment includes a crystal very close to a single crystal. Besides, the value of 2.4 to 2.6 cm$^{-1}$ is also very small (single crystal silicon film measured as reference was 2.1 cm$^{-1}$), and this means that crystallinity is high.

Incidentally, in the present specification, the Raman peak value is a peak value obtained when fitting with a Lorentz distribution is carried out to a Raman spectrum obtained when a crystal-containing semiconductor film (in this embodiment, polysilicon film) is irradiated with Ar laser light having a wavelength of 514.5 nm and a light intensity of $1.0 \times 10^5$ to $1.3 \times 10^5$ W/cm$^2$. In the actual measurement, "RAMASCOPE MICROSCOPIC RAMAN APPARATUS SYSTEM 2000" which is a microscope Raman measuring apparatus manufactured by RENISHAW Inc. was used.

The half width at half maximum is a value of half of a half width obtained when fitting with a Lorentz distribution is carried out to a Raman spectrum obtained when a crystal-containing semiconductor film is irradiated with Ar laser light having a wavelength of 514.5 nm and a light intensity of $1.0 \times 10^5$ to $1.3 \times 10^5$ W/cm$^2$. This value was also measured by the foregoing Raman measuring apparatus.

With respect to the Raman peak value and the half width at half maximum each having the foregoing definition, it was found that in the polysilicon film 1107 of this embodiment, the ratio of the Raman peak value to the half width at half maximum (Raman peak value divided by half width at half maximum) was 170 to 240 (typically 190 to 220).

After the polysilicon film 1107 with extremely high crystallinity was obtained in this way, this polysilicon film 1107 was patterned so that an active layer 108 shown in FIG. 2A was formed. Incidentally, in this embodiment, although the heat treatment in the hydrogen atmosphere is carried out before the active layer is formed, the heat treatment may be carried out after the active layer is formed. That case is preferable since stress generated in the polysilicon film is relieved through the state that the film has been patterned.

Then a thermal oxidation step was carried out so that a silicon oxide film 109 with a thickness of 10 nm was formed on the surface of the active layer 108. This silicon oxide film 109 functions as a gate insulating film. Besides, since the film thickness of the active layer 108 was decreased through this oxidation by 5 nm, the thickness became 45 nm. In view of the film decrease by the thermal oxidation, it is necessary to determine the film thickness of the initial semiconductor film (initially formed semiconductor film) so that an active layer (especially a channel formation region) with a thickness of 10 to 50 nm finally remains.

After the gate insulating film 109 was formed, a polysilicon film having conductivity was formed thereon and a gate wiring line 110 was formed by patterning. (FIG. 2A)

In this embodiment, although polysilicon having N-type conductivity is used for the gate wiring line, a material is not limited to this. Particularly, for the purpose of lowering the resistance of the gate wiring line, it is also effective to use tantalum, tantalum alloy, or a laminated film of tantalum and tantalum nitride. In order to obtain a gate wiring line of further low resistance, it is also effective to use copper or copper alloy.

After the state of FIG. 2A was obtained, an impurity to give N-type conductivity or P-type conductivity was added to form an impurity region 111. The impurity concentration at this time was determined in view of the impurity concentration of a subsequent LDD region. In this embodiment, although arsenic with a concentration of $1 \times 10^{18}$ atoms/cm$^3$ was added, it is not necessary to limit the impurity and the concentration to those of this embodiment.

Next, a thin silicon oxide film 112 with a thickness of about 5 to 10 nm was formed on the surface of the gate wiring line 110. It is appropriate that this film is formed by using a thermal oxidation method or a plasma oxidation method. This silicon oxide film 112 functions as an etching stopper in a subsequent side wall forming step.

After the silicon oxide film 112 to become an etching stopper was formed, a silicon nitride film was formed and etch back was carried out, so that a side wall 113 was formed. In this way, the state of FIG. 2B was obtained.

Incidentally, in this embodiment, although the silicon nitride film was used as the side wall, it is also possible to use a polysilicon film or an amorphous silicon film. Of course, it is needless to say that if a material of the gate wiring line is changed, a material which can be used as the side wall is also changed according to that.

Next, an impurity with the same conductivity as that in the previous step was again added. The concentration of the impurity added at this time was made higher than that in the previous step. In this embodiment, although arsenic is used as the impurity and its concentration is made $1 \times 10^{21}$ atoms/cm$^3$, it is not necessary to make limitation to this. By the adding step of the impurity, a source region 114, a drain region 115, an LDD region 116, and a channel formation region 117 were defined. (FIG. 2C)

After the respective impurity regions were formed in this way, activation of the impurity was carried out by a heat treatment such as furnace annealing, laser annealing, or lamp annealing.

Next, silicon oxide films formed on the surfaces of the gate wiring line 110, the source region 114, and the drain region 115 were removed to expose the surfaces of those. Then a cobalt film (not shown) with a thickness of about 5 nm was formed and a heat treatment step was carried out. A reaction of cobalt and silicon occurred by this heat treatment, so that a silicide layer (cobalt silicide layer) 118 was formed. (FIG. 2D)

This technique is a well-known self-aligned silicide technique. Thus, instead of cobalt, titanium or tungsten may be used, and an annealing condition and the like may be determined by referring to a well-known technique. In this embodiment, a lamp annealing treatment step was carried out by irradiation of infrared light.

After the silicide layer 118 was formed in this way, the cobalt film was removed. Thereafter, an interlayer insulating film 119 with a thickness of 1 µm was formed. As the interlayer insulating film 119, it is appropriate that a silicon oxide film, a silicon nitride film, a silicon nitride oxide film, or a resin film (polyimide, acryl, polyamide, polyimide-amide, benzocyclobutene (BCB), etc.) is used. These insulating films may be laminated in a free combination.

Next, contact holes were formed in the interlayer insulating film 119, and a source wiring line 120 and a drain wiring line 121 made of a material containing aluminum as its main ingredient were formed. Finally, the whole component was subjected to furnace annealing at 300° C. for 2 hours in a hydrogen atmosphere, so that hydrogenating was completed.

A TFT as shown in FIG. 2D was obtained in this way. Incidentally, the structure explained in this embodiment is merely an example, and a TFT structure to which the present invention can be applied is not limited to this. The present invention can be applied to a TFT of any well-known structure. Besides, it is not necessary to limit numerical value conditions in the steps subsequent to formation of the polysilicon film 1107 to those of this embodiment. Further, there is no problem even if a well-known channel doping step (impurity adding step for, controlling a threshold voltage) is introduced to somewhere in this embodiment.

Besides, in this embodiment, since the concentration of impurities such as C, N, and O was thoroughly controlled at the stage of film formation of the amorphous silicon film as the initial film, the concentration of each impurity contained in the active layer of the completed TFT was such that the concentration of carbon and nitrogen remained to be $5 \times 10^{18}$ atoms/cm$^3$ or less (preferably $5 \times 10^{17}$ atoms/cm$^3$ or less), and the concentration of oxygen remained to be $1 \times 10^{19}$ atoms/cm$^3$ or less (preferably $5 \times 10^{18}$ atoms/cm$^3$ or less). The concentration of metal elements except nickel was $1 \times 10^{17}$ atoms/cm$^3$ or less.

Besides, it is needless to say that the present invention can be readily applied to not only a top gate structure but also to a bottom gate structure typified by an inverted staggered structure TFT.

Besides, although the description has been made on the N-channel TFT as an example, it is also easy to manufacture a P-channel TFT through combination with a well-known technique. Further, through combination with a well-known technique, it is also possible to form a CMOS circuit by forming an N-channel TFT and a P-channel TFT on the same substrate and by complementarily combining them.

Further, in the structure of FIG. 2D, if a pixel electrode (not shown) electrically connected to the drain wiring line 121 is formed by a well-known means, it is also easy to form a pixel switching element of an active matrix type display device. That is, the present invention can also be carried out when an active matrix type electro-optical device such as a liquid crystal display device or an EL (electroluminescence) display device is manufactured.

[Embodiment 6]

In this embodiment, an example in which a polysilicon film is obtained by a method different from Embodiment 5, will be described with reference to FIGS. 6A to 6E. Since its basic structure is almost the same as Embodiment 5, the description will be made while attention is paid to only different points.

Figure 6A:
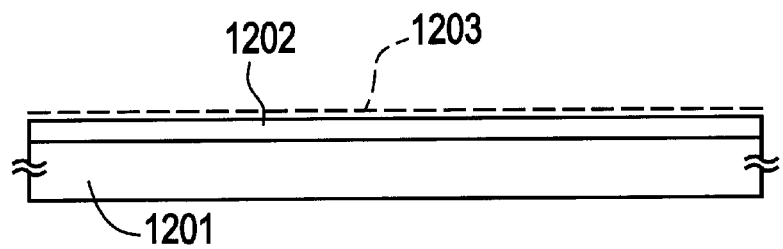
FIGS. 6A to 6E are views showing manufacturing steps of a thin film transistor.
Figure 6B:
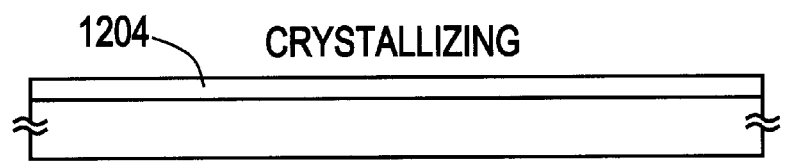
Figure 6C:

In this embodiment, steps up to a step of obtaining the state of FIG. 5C are the same as those of Embodiment 5. First, a semiconductor film (in this embodiment, amorphous silicon film) 1202 with a thickness of 90 nm was formed on a quartz substrate 1201, and a nickel-containing layer 1203 was formed on its surface. (FIG. 6A) Then a heat treatment at a temperature of 500 to 700° C. (typically 550 to 650° C.) for 4 to 24 hours was carried out in an inert gas atmosphere, a hydrogen atmosphere, or an oxygen atmosphere, so that a polysilicon film 1204 was obtained. (FIG. 6B) Thereafter, the polysilicon film 1204 was irradiated with excimer laser light, so that a polysilicon film 1205 was obtained. (FIG. 6C)

Next, a furnace annealing treatment at 1000° C. for 2 hours was carried out to the polysilicon film 1205 obtained by carrying out this laser annealing step. In this embodiment, although the treatment atmosphere was made the hydrogen atmosphere, there is no problem as long as a reduced atmosphere is used. Even if an inert gas atmosphere such as a nitrogen atmosphere is used, an object of improving the crystallinity can be achieved. By this step, a polysilicon film 1206 having a flat surface was obtained. (FIG. 6D)

Figure 6D:
Figure 6E:

After the state of FIG. 6D was obtained in this way, a furnace annealing treatment (heat treatment using an electrothermal furnace) at 1000° C. for 30 minutes was carried out in an oxidizing atmosphere. At this time, the film thickness of the polysilicon film 1206 was decreased by the thermal oxidation treatment (thinning treatment), so that a polysilicon film 1207 thinner than the polysilicon film 1206 was formed (FIG. 6E).

In this thermal oxidation step, defects and the like in the polysilicon film are repaired by surplus silicon atoms produced when the oxidizing reaction proceeds, so that it was possible to obtain the polysilicon film with very few defects. Besides, the thickness of the polysilicon film was thinned, so that the initial thickness of 90 nm was changed to 60 nm.

Moreover, since the oxidation reaction progresses while scraping the surface layer of the polysilicon film which was flattened by the furnace annealing treatment in the reduced atmosphere, the formed polysilicon film 1207 became a semiconductor film with a further flat surface. Hereafter, this effectively serves to decrease levels in an interface between an active layer and a gate insulating film of a TFT. In addition, since the obtained oxidation film has an extremely flat surface, it can be used as a gate insulating film or a part thereof.

Incidentally, when this thinning step is repeated plural times, the flatness of the polysilicon film is further improved. In that case, the thermal oxidation step and the removing step of the thermal oxidation film are alternately repeated.

Since the subsequent steps are the same as those of Embodiment 5, their explanation will be omitted. That is, this embodiment can be combined with Embodiment 5.

[Embodiment 7]

In this embodiment, an example in which a polysilicon film is obtained by a method different from Embodiment 5, will be described with reference to FIGS. 7A to 7D. Since its basic structure is almost the same as Embodiment 5, the description will be made while attention is paid to only different points.

Figure 7A:
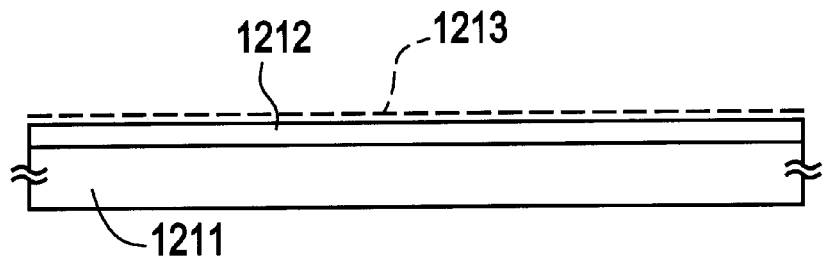
FIGS. 7A to 7D are views showing manufacturing steps of a thin film transistor.
Figure 7B:
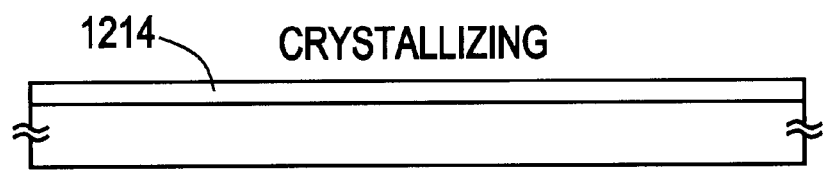
Figure 7C:
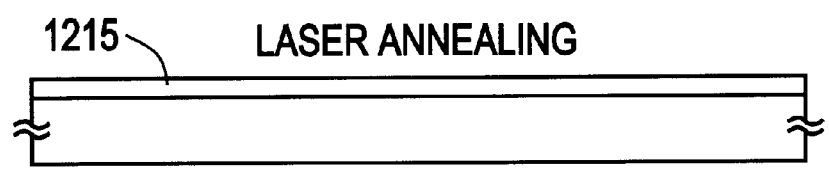

In this embodiment, steps up to a step of obtaining the state of FIG. 5C are the same as those of Embodiment 5. First, a semiconductor film (in this embodiment, amorphous silicon film) 1212 with a thickness of 90 nm was formed on a quartz substrate 1211, and a nickel-containing layer 1213 was formed on its surface. (FIG. 7A) Then a heat treatment at a temperature of 500 to 700° C. (typically 550 to 650° C.) for 4 to 24 hours was carried out in an inert gas atmosphere, a hydrogen atmosphere, or an oxygen atmosphere, so that a polysilicon film 1214 was obtained. (FIG. 7B) Thereafter, the polysilicon film 1214 was irradiated with excimer laser light, so that a polysilicon film 1215 was obtained. (FIG. 7C)

Figure 7D:
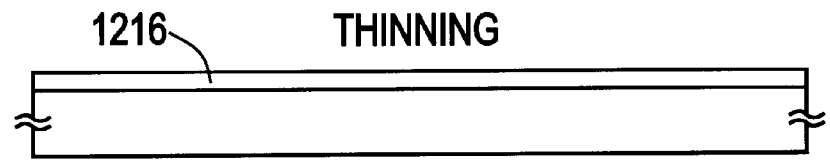

Next, a furnace annealing treatment (heat treatment using an electrothermal furnace) was carried out in an oxidizing atmosphere to the polysilicon film 1215 obtained by carrying out this laser annealing step. At this time, the film thickness of the polysilicon film 1215 was decreased by the thermal oxidation treatment (thinning treatment), so that a polysilicon film 1216 thinner than the polysilicon film 1215 was formed. (FIG. 7D)

Incidentally, when this thinning step is repeated plural times, the flatness of the polysilicon film is further improved. In that case, the thermal oxidation step and the removing step of the thermal oxidation film are alternately repeated.

Since the subsequent steps are the same as those of Embodiment 5, their explanation will be omitted. That is, this embodiment can be combined with Embodiment 5. Incidentally, the feature of this embodiment is that the thermal oxidation step also serves as the furnace annealing step explained in the Embodiment 6.

[Embodiment 8]

In this embodiment, an example in which an initial film initially formed on a substrate is made a polysilicon film, will be described with reference to FIGS. 8A to 8D.

Figure 8A:
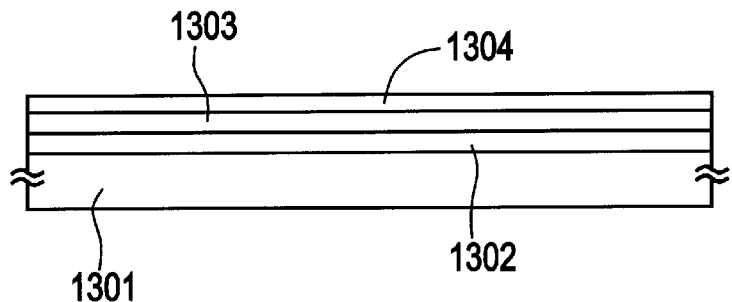
FIGS. 8A to 8D are views showing manufacturing steps of a thin film transistor.

First, an underlying film 1302 made of a silicon oxide film, a polysilicon film 1303 with a thickness of 75 nm, and a protection film 1304 are continuously formed and laminated on a metal substrate (in this embodiment, tantalum substrate) 1301 without making opening to the air. Incidentally, in this embodiment, film formation is carried out in a multichamber system low pressure CVD apparatus having a vacuum load-lock chamber and a common chamber. (FIG. 8A)

Next, a laser annealing step is carried out with KrF excimer laser light while the protection film 1304 is made to remain. A laser irradiation condition of this embodiment was such that linear laser light having an oscillation frequency of 30 Hz and a beam shape of 145×0.41 mm was used. Besides, the substrate was scanned with the laser light at 1.2 mm/sec from one end of the substrate to the other end, and an overlap of adjacent linear laser light was made 92%.

Figure 8B:
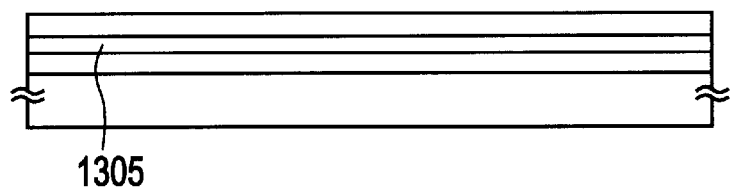

Besides, in the case of this embodiment, the laser annealing step is carried out under the condition that the laser energy density is 250 to 5000 mJ/cm$^2$ (preferably 500 to 1000 mJ/cm$^2$). In this embodiment, the laser energy density is made 600 mJ/cm$^2$. Incidentally, a method of measuring the laser energy density is the same as Embodiment 5. In this way, a polysilicon film 1305 is formed. (FIG. 8B)

Figure 8C:
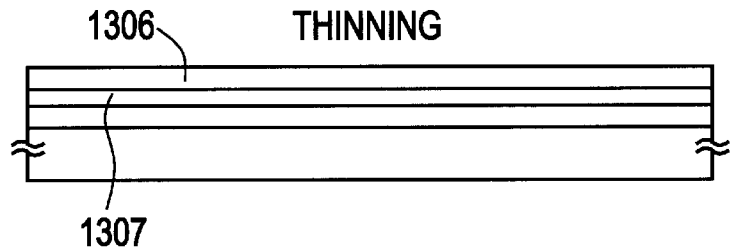
Figure 8D:
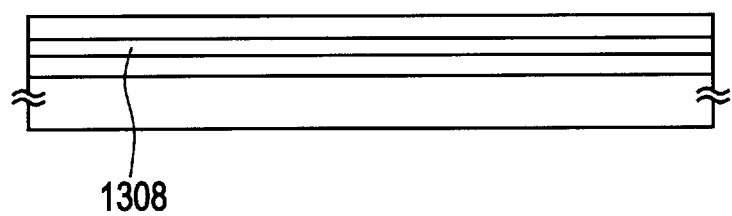

Next, a thermal oxidation step at 1050° C. for 30 minutes is carried out. In this embodiment, for the purpose of carrying out the heat treatment while relieving stress, a wet oxidation method containing water vapor was used. The thickness of a polysilicon film 1307 obtained through this step is decreased to 50 nm by oxidation. The thickness of a protection film 1306 is increased by a formed thermal oxidation film. (FIG. 8C)

Of course, this thermal oxidation step is carried out as a thinning step for further thinning the polysilicon film. When this thinning step is carried out plural times, the flatness of the polysilicon film is further improved. In that case, it is appropriate that the thermal oxidation step and the removing step of the thermal oxidation film are alternately repeated.

After the thermal oxidation step is completed in this way, a furnace annealing treatment at 1100° C. for 2 hours is carried out in a nitrogen atmosphere to improve crystallinity of the polysilicon film 1307. By this step, a polysilicon film 1308 is obtained. (FIG. 8D) The thus obtained polysilicon film 1308 shows specific orientation on the whole film surface, and becomes a semiconductor film regarded as substantially a single crystal film.

Since the polysilicon film 1308 formed in the manner described above has been treated in all the steps of FIGS. 8A to 8D without being exposed to the outside air, this film has an extremely clean interface. This is an effect obtained by two structures that the step of FIG. 8A is carried out in continuous film formation without making opening to the air, and that all treatments are carried out through the protection film.

Besides, the Raman peak value and the half width at half maximum also fall within the range explained in Embodiment 5.

Incidentally, in this embodiment, although the polysilicon film is used as the initial film (most initially formed semiconductor film), it is also possible to first form a microcrystal silicon film or an amorphous silicon film and to crystallize the film through a protection film by a laser. Of course, a semiconductor material other than silicon may be used.

After the polysilicon film 1308 is obtained in this way, it is satisfactory if a TFT is subsequently manufactured in the same procedure as Embodiment 5. Of course, the TFT can be manufactured by not only the procedure of Embodiment 5 but also a well-known means.

[Embodiment 9]

In this embodiment, an example in which crystallization of an amorphous silicon film as an initial film is carried out by a technique disclosed in the Japanese Patent Application Laid-open No. 8-78329, will be described with reference to FIGS. 9A to 9G.

First, a quartz substrate 1401 having a surface provided with an insulating film is prepared, and an amorphous silicon film (not shown) and a silicon oxide film (not shown) are continuously formed and laminated thereon without making opening to the air. Next, the silicon oxide film is patterned to form a mask 1402 having an opening portion.

Next, a solution containing nickel of 100 ppm in terms of weight is applied by a spin coating method, so that such a state that the amorphous silicon film is in contact with nickel is obtained at the bottom of the opening portion. Thereafter, a furnace annealing step at 570° C. for 14 hours is carried out to obtain a lateral growth region 1403.

Incidentally, in the lateral growth region 1403, since rod-like crystals grow in a direction almost parallel to the substrate, this region becomes a semiconductor film in which the number of defects and trap levels are small as compared with a polysilicon film in which nucleus generation occurs at random.

Figure 9A:
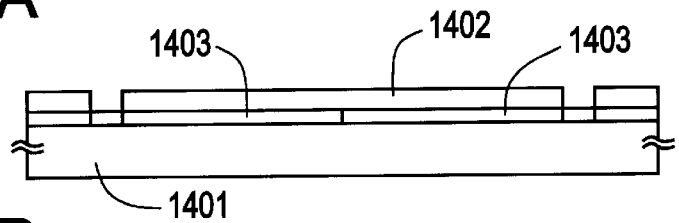
FIGS. 9A to 9G are views showing manufacturing steps of a thin film transistor.

Besides, in the state of FIG. 9A, there is obtained a semiconductor film in which a region remaining as an amorphous component and the lateral growth region (region containing a crystal component) are mixed to each other. In the present specification, such a film is also called a semiconductor film (or crystal-containing semiconductor film).

Figure 9B:
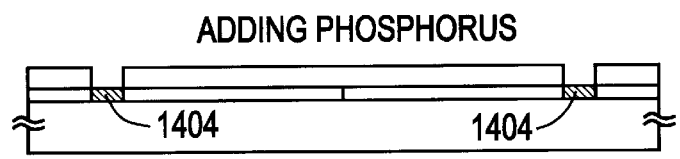

After the state of FIG. 9A is obtained in this way, the mask 1402 is kept using as a mask and phosphorus is added by a plasma doping method or an ion implantation method. The addition amount of phosphorus is adjusted so that its concentration in the silicon film becomes $1\times10^{19}$ to $1\times10^{21}$ atoms/cm$^3$ in the SIMS. (FIG. 9B)

The region in which phosphorus with a high concentration is added in this way is called a gettering region 1404 in the present specification.

Figure 9C:
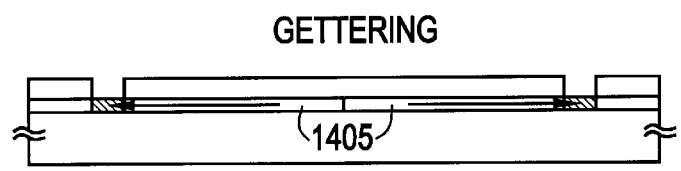

After the gettering region 1404 is formed, a furnace annealing step at 600° C. for 12 hours is carried out, so that nickel existing in the lateral growth region 1403 is made to be gettered into the gettering region 1404. In this way, a lateral growth region 1405 in which nickel concentration in the film is lowered to $1\times10^{17}$ atoms/cm$^3$ or less is obtained. (FIG. 9C)

Next, patterning is carried out so that an island-like semiconductor film 1406 formed of only the lateral growth region 1405 is obtained. At this time, since the gettering region contains phosphorus and nickel with a high concentration, it is desirable to completely remove the region.

Figure 9D:
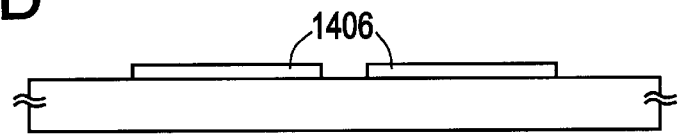
Figure 9E:
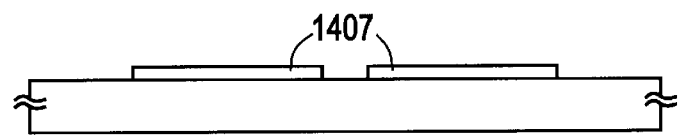

In this way, the stage of FIG. 9D is obtained. Next, a laser annealing treatment is carried out by using XeCl excimer laser light. The laser irradiation condition of this embodiment is made the same as Embodiment 5. In this way, an island-like semiconductor film 1407 is obtained. (FIG. 9E)

Figure 9F:
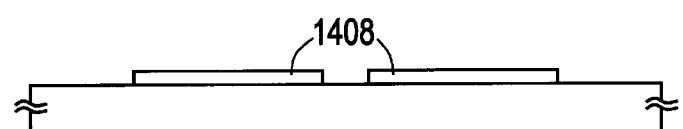

Next, a furnace annealing treatment at 1000° C. for 30 minutes is carried out in an oxygen atmosphere so that a thermal oxidation step (thinning step) is carried out. A thermal oxidation film (not shown) formed at this time may be removed here, or may be made to remain until a next furnace annealing treatment is carried out. (FIG. 9F)

Figure 9G:
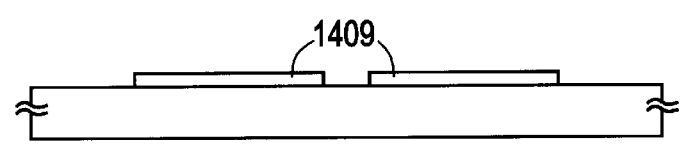

After an island-like semiconductor film 1408 in which its thickness is decreased by the thinning step is obtained in this way, a furnace annealing treatment at 1100° C. for 2 hours is carried out in an atmosphere in which hydrogen and nitrogen are mixed. In this way, an island-like semiconductor film 1409 is obtained. (FIG. 9G)

The island-like semiconductor film 1409 formed in the manner described above has crystallinity comparable to the polysilicon film explained in Embodiment 5 and Embodiment 6. That is, the whole film surface shows specific orientation, and this film is a semiconductor film which can be regarded as substantially a single crystal film.

Besides, the Raman peak value and the half width at half maximum obtained through the Raman measurement become the same as those explained in Embodiment 5.

Incidentally, the structure of this embodiment can be combined with any of the structures of Embodiments 1 to 7.

[Embodiment 10]

In Embodiments 5 to 7, an element (specifically, nickel) for promoting crystallization is used at crystallization of an initial film. However, even if the steps of the present invention are applied to a polysilicon film (this is also a crystal-containing semiconductor film) crystallized through natural nucleus generation, a satisfactory effect can be obtained.

In that case, an underlying film, an amorphous silicon film, and a protection film are continuously formed and laminated without making opening to the air, and the amorphous silicon film is crystallized into a polysilicon film by a furnace annealing treatment at 600° C. for 24 hours, so that the polysilicon film with a clean interface can be obtained as well.

However, in the case where crystallization of a semiconductor film is carried out with natural nucleus generation as in this embodiment, it is desirable that the film has a thickness of 80 to 120 nm (typically 90 to 100 nm). That is, it is empirically known that if an initial film is thin from the start, the efficiency of crystallization becomes low.

In such a case, it is important to carry out thinning (to decrease the film thickness) of the crystal-containing semiconductor film by adding an oxidation step after completion of crystallization. By doing so, crystallization is effectively carried out, and thereafter, a polysilicon film with a desired thickness can be obtained.

Incidentally, the structure of this embodiment can be combined with any of the structures of Embodiments 5 to 7 and Embodiment 9.

[Embodiment 11]

Figure 11A:
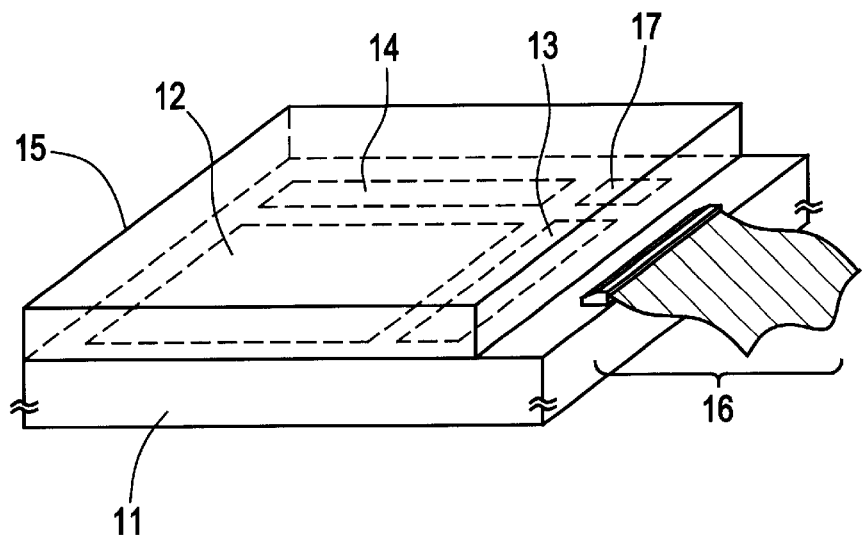
FIGS. 11A to 11C are views showing the structure of an electro-optical device.
Figure 11B:
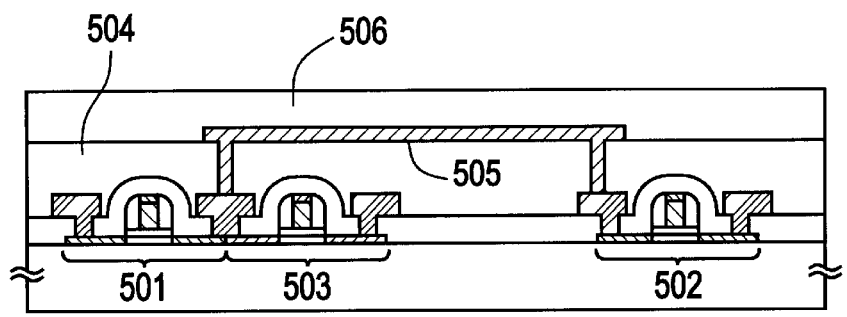
Figure 11C:
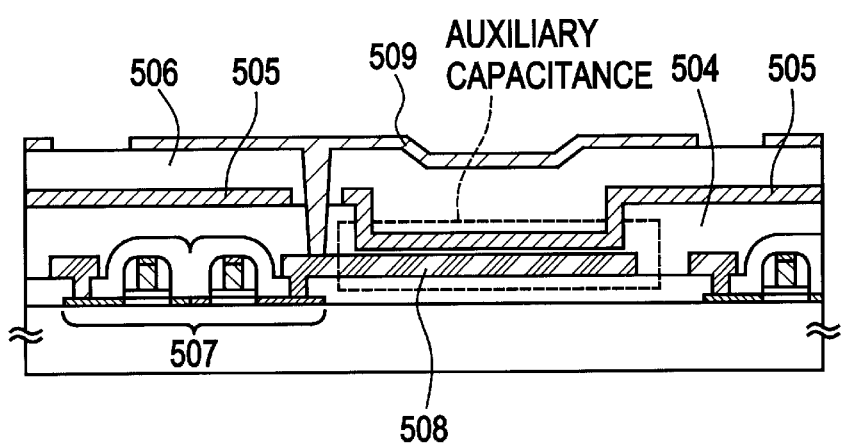

In this embodiment, an example of a reflection-type liquid crystal display device manufactured in accordance with the present invention will be shown in FIGS. 11A to 11C. Since well-known means may be used for a manufacturing method of a pixel TFT (pixel switching element) and for a cell assembling step, their detailed description will be omitted.

In FIG. 11A, reference numeral 11 denotes a substrate having an insulating surface (ceramic substrate provided with a silicon oxide film), 12 denotes a pixel matrix region, 13 denotes a source driver circuit, 14 denotes a gate driver circuit, 15 denotes an opposite substrate, 16 denotes an FPC (Flexible Printed Circuit), and 17 denotes a signal processing circuit. As the signal processing circuit 17, a circuit for carrying out such processing that an IC has been conventionally substituted, such as a D/A converter, a gamma-correction circuit, and a signal dividing circuit, can be formed. Of course, it is also possible to provide an IC chip on the substrate and to carry out signal processing on the IC chip.

Moreover, in this embodiment, although the description has been made on the liquid crystal display device as an example, it is needless to say that the present invention can also be applied to an EL (electroluminescence) display device or an EC (electrochromic) display device as long as the device is an active matrix type display device.

Here, an example of circuits constituting the driver circuits 13 and 14 of FIG. 11A will be shown in FIG. 11B. Since a TFT portion has been explained in Embodiment 1, only necessary portions will be described here.

In FIG. 11B, reference numerals 501 and 502 denote N-channel TFTs, and 503 denotes a P-channel TFT. The TFTs 501 and 503 constitute a CMOS circuit. Reference numeral 504 denotes an insulating layer made of a laminated film of a silicon nitride film, a silicon oxide film and a resin film. A titanium wiring line 505 is provided thereon, and the CMOS circuit and the TFT 502 are electrically connected. The titanium wiring line is covered with an insulating layer 506 made of a resin film. The two insulating layers 504 and 506 have also a function as a flattening film.

Moreover, a part of a circuit constituting the pixel matrix region 12 of FIG. 11A will be shown in FIG. 11C. In FIG. 11C, reference numeral 507 denotes a pixel TFT made of a double gate structure N-channel TFT, and a drain wiring line 508 is formed so as to widely extend in a pixel region. Incidentally, other than the double gate structure, a single gate structure, a triple gate structure, or the like may be adopted.

An insulating layer 504 is provided thereon, and a titanium wiring line 505 is provided thereon. At this time, a recess portion is formed in a part of the insulating layer 504, and only silicon nitride and silicon oxide of the lowermost layer are made to remain. By this, an auxiliary capacitance is formed between the drain wiring line 508 and the titanium wiring line 505.

The titanium wiring line 505 provided in the pixel matrix region has an electric field shielding effect between a source/drain wiring line and a subsequent pixel electrode. Further, it also functions as a black mask at a gap between a plurality of pixel electrodes.

Then an insulating layer 506 is provided to cover the titanium wiring line 505, and a pixel electrode 509 made of a reflective conductive film is formed thereon. Of course, contrivance for increasing reflectivity may be made to the surface of the pixel electrode 509.

Actually, although an orientated layer and a liquid crystal layer are provided on the pixel electrode 509, their explanation will be omitted here.

By using the present invention, it is possible to manufacture the reflection-type liquid crystal display device of the structure as described above. Of course, when a well-known technique is combined, a transmission-type liquid crystal display device can also be easily manufactured.

Although not distinguished in the drawings, it is also possible to make the film thicknesses of gate insulating films different between the pixel TFT constituting the pixel matrix circuit and the CMOS circuit constituting the driver circuit or the signal processing circuit.

In the pixel matrix region, since a driving voltage applied to the TFT is high (10 V or more), the gate insulating film with a thickness of 50 to 200 nm (preferably 100 to 150 nm) is required. On the other hand, in the driver circuit or the signal processing circuit, a driving voltage applied to the TFT is low (1 to 5 V), while high speed operation is required. Thus, it is effective to make the film thickness of the gate insulating film about 3 to 30 nm (preferably 5 to 10 nm), which is thinner than that of the pixel TFT.

[Embodiment 12]

The present invention can be applied to all conventional IC techniques. That is, the present invention can be applied to all semiconductor circuits presently put on the market. For example, the invention may be applied to a microprocessor such as an RISC processor integrated on one chip or an ASIC processor, and may be applied to a signal processing circuit typified by a driver circuit for liquid crystal (D/A converter, gamma-correction circuit, signal dividing circuit, etc.) or a high frequency circuit for a portable equipment (portable telephone, PHS, mobile computer).

Figure 12A:
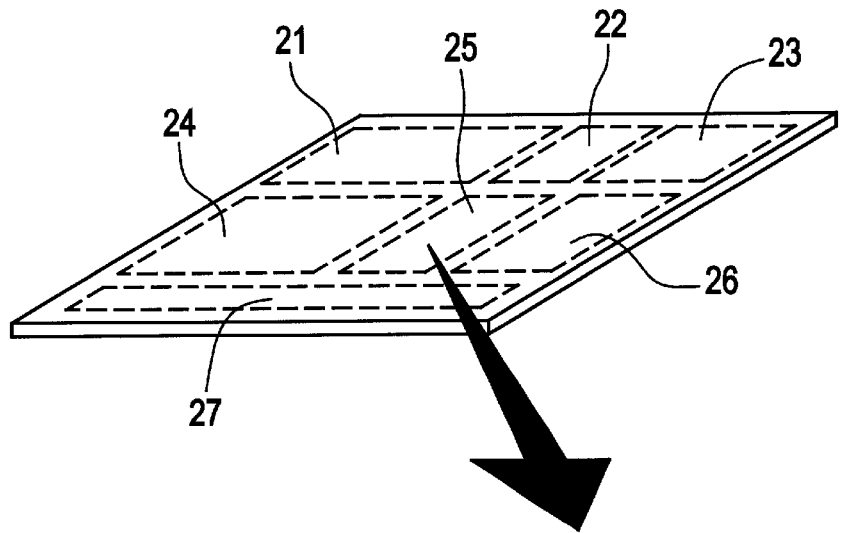
FIGS. 12A to 12C are views showing the structure of a semiconductor circuit.

FIG. 12A shows an example of a microprocessor. The microprocessor is typically constituted by a CPU core 21, a RAM 22, a clock controller 23, a cache memory 24, a cache controller 25, a serial interface 26, an I/O port 27, and the like.

Of course, the microprocessor shown in FIG. 12A is simplified example, and various circuit designs are made for an actual microprocessor according to its use.

Figure 12B:
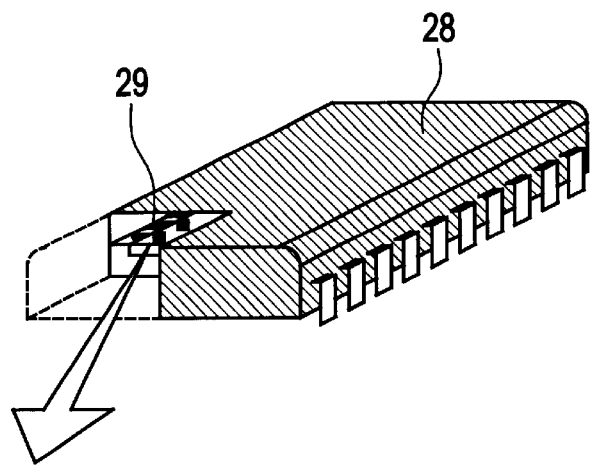

However, in any microprocessor having any function, the IC (Integrated Circuit) 28 shown in FIG. 12B functions as its center. The IC 28 is a functional circuit in which an integrated circuit formed on a semiconductor chip 29 is protected with a ceramic or the like.

Figure 12C:
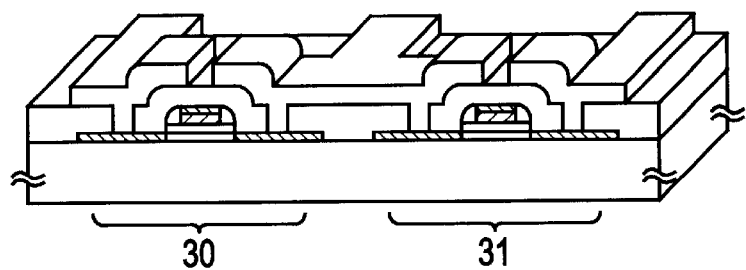

An N-channel TFT 30 and a P-channel TFT 31 each having a structure of the present invention constitute the integrated circuit formed on the semiconductor chip 29. (FIG. 12C) Incidentally, if a basic circuit is constituted by a CMOS circuit as a minimum unit, power consumption can be suppressed.

The microprocessor shown in this embodiment is mounted on various electronic equipments, and functions as the central circuit. As typical electronic equipments, a personal computer, a portable information terminal equipment, and other all electric household appliances can be enumerated. Besides, a computer for controlling a vehicle (automobile, electric train, etc.) can also be enumerated.

It is needless to say that the structure of this embodiment can be combined with any of the structures of Embodiments 1 to 11.

[Embodiment 13]

The CMOS circuit and the pixel matrix circuit formed by carrying out the present invention can be used for various electro-optical devices (active matrix type liquid crystal display, active matrix type EL display, active matrix type EC display). In other words, the present invention can be embodied in all the electronic equipments incorporating those electro-optical devices as a display medium.

As such electronic equipments, a video camera, a digital camera, a projector (rear-type or front-type), a head mount display (goggle type display), a navigation system for vehicles, a personal computer, a portable information terminal (mobile computer, portable phone, electronic book, etc.) and the like are enumerated. Those examples are shown in FIGS. 13A to 13F and FIGS. 14A to 14D.

Figure 13A:
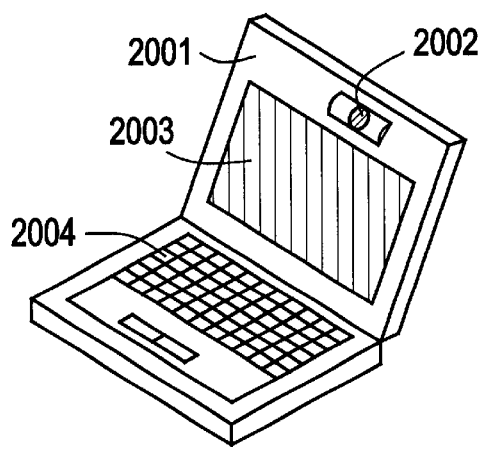
FIGS. 13A to 13F are views showing structures of electronic equipments.

FIG. 13A shows a personal computer, which is made up of a main body 2001, an image input section 2002, a display unit 2003 and a keyboard 2004. The present invention can be applied to the image input section 2002, the display unit 2003 and other signal control circuits.

Figure 13B:
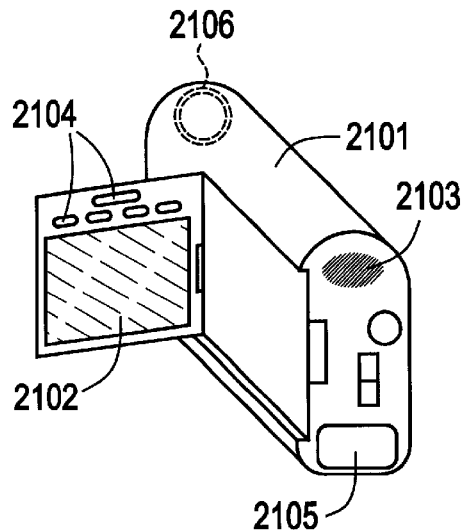

FIG. 13B shows a video camera, which is made up of a main body 2101, a display unit 2102, an audio input section 2103, an operation switch 2104, a battery 2105 and an image receiving section 2106. The present invention can be applied to the display unit 2102, the audio input section 2103 and other signal control circuits.

Figure 13C:
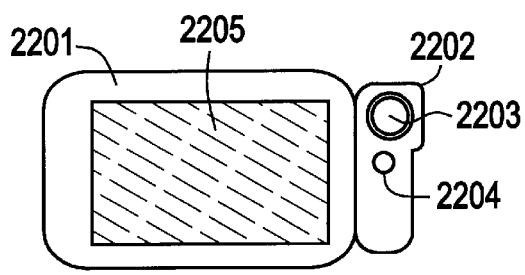

FIG. 13C shows a mobile computer, which is made up of a main body 2201, a camera section 2202, an image receiving section 2203, an operation switch 2204 and a display unit 2205. The present invention can be applied to the display unit 2205 and other signal control circuits.

Figure 13D:
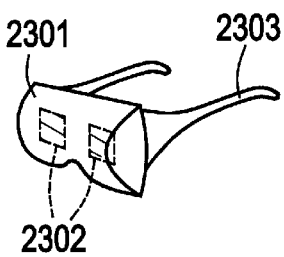

FIG. 13D shows a goggle type display, which is made up of a main body 2301, a display unit 2302 and an arm section 2303. The present invention can be applied to the display unit 2302 and other signal control circuits.

Figure 13E:
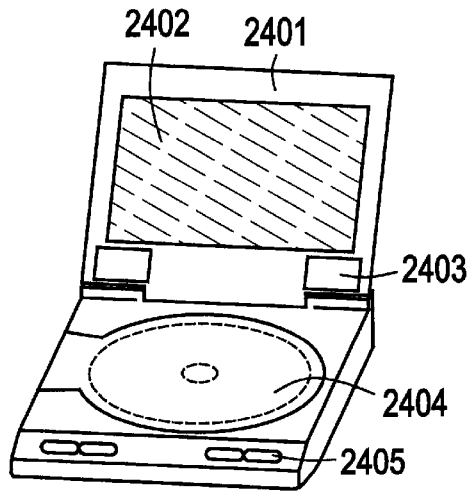

FIG. 13E shows a player using a recording medium (hereinafter referred to as recording medium) in which program is recorded, and which is made up of a main body 2401, a display unit 2402, a speaker section 2403, a recording medium 2404 and an operation switch 2405. Incidentally, this apparatus provides the measure for music appreciation, movie appreciation, playing game, or connecting to internet by using a DVD (digital versatile disc), a CD, etc. as a recording medium. The present invention can be applied to the display unit 2402 and other signal control circuits.

Figure 13F:
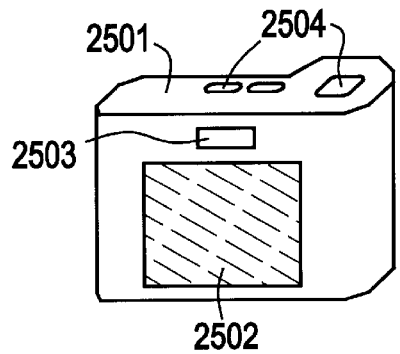

FIG. 13F shows a digital camera, which is made up of a main body 2501, a display unit 2502, an eye piece section 2503, an operation switch 2504 and an image receiving section (not shown). The present invention can be applied to the display unit 2502 and other signal control circuits.

Figure 14A:
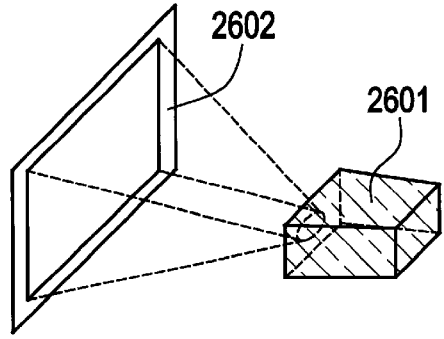
FIGS. 14A to 14D are views showing structures of electronic equipments.

FIG. 14A shows a front type projector, which is made up of a display unit 2601 and a screen 2602. The present invention can be applied to the display unit 2601 and other signal control circuits.

Figure 14B:
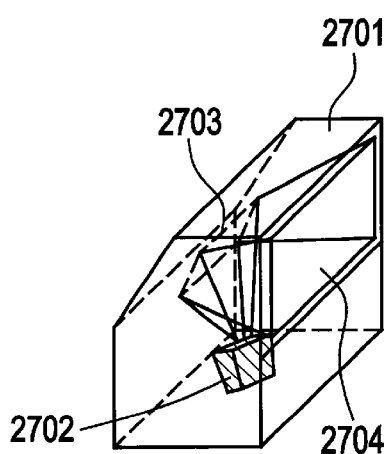

FIG. 14B shows a rear type projector, which is made up of a main body 2701, a display unit 2702, a mirror 2703 and a screen 2704. The present invention can be applied to the display unit 2702 and other signal control circuits.

Figure 14C:
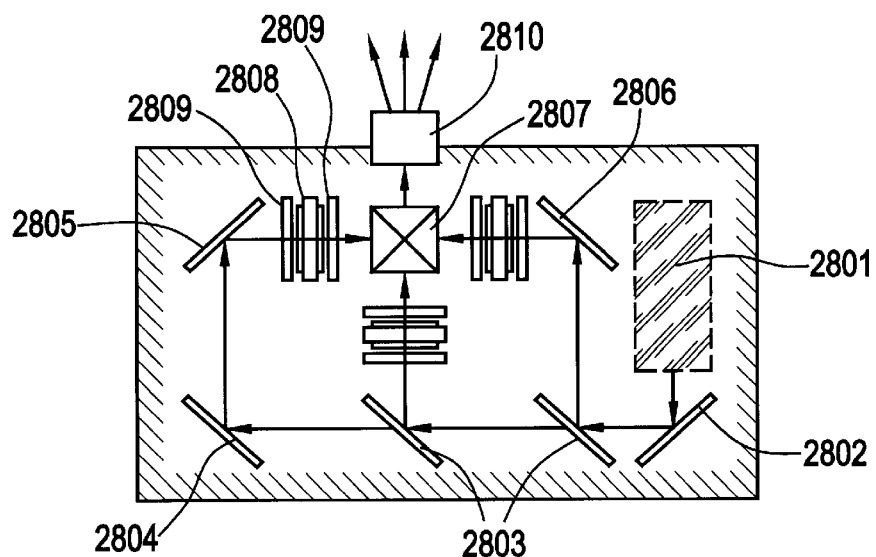

FIG. 14C is a diagram showing an example of the structure of the display units 2061, 2702 in FIGS. 14A and 14B. The display units 2601 and 2702 are made up of a light source optical system 2801, mirrors 2802, 2804 to 2806, dichroic mirrors 2803, a prism 2807, a liquid crystal display device 2808, phase difference plates 2809 and a projection optical system 2810. The projection optical system 2810 is made up of an optical system including a projection lens. Although this embodiment is illustrated with an example of three-plate type, the present invention is not particularly limited to this, and for example, a single-plate type may be used. Further, in FIG. 14C, an optical system such as an optical lens, a film having a polarization function, a film for adjusting a phase difference and an IR film may be provided in an optical path indicated by an arrow at discretion of a person who carries out the invention.

Figure 14D:
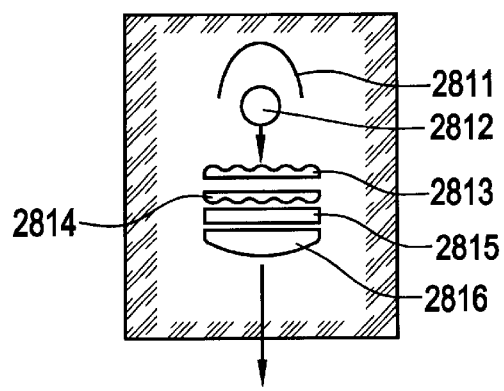

FIG. 14D is a diagram showing an example of the structure of the light source optical system 2801 in FIG. 14C. In this embodiment, the light source optical system 2801 is made up of a reflector 2811, light sources 2812, 2813, 2814, a polarization conversion element 2815 and a condenser 2816. Incidentally, the light source optical system shown in FIG. 14D is one example, and the present invention is not particularly limited to this. For example, an optical system such as an optical lens, a film having a polarization function, a film for adjusting a phase difference and an IR film may be provided in the light source optical system at discretion of a person who carries out the invention.

As described above, the application range of the present invention is extremely broad, and the present invention is applicable to the electronic equipments in any fields. Also, the electronic equipments of this embodiment can be realized by using the structure resulting from any combination of Embodiments 1 to 12.

[Embodiment 14]

A crystal-containing semiconductor film obtained in the steps described in Embodiment 1 to Embodiment 4 shows specific orientation on the whole film surface. That is, the semiconductor film has such a feature that even if the film has a mode like a polycrystal semiconductor film which is formed of an aggregation of individual crystal grains, the crystal grains of 80% or more (typically 90% or more) of the total show the same crystal plane (orientation plane). Like this, a crystal plane occupying 80% or more of the total will be referred to as a main orientation plane.

The main crystal plane of the semiconductor film (crystal-containing semiconductor film) formed through the process of the present invention is either one of a {110} plane, a {100} plane, a {111} plane, a {311} plane, a {511} plane, and a crystal plane in which the {110} plane and the {100} plane are mixed. At present, it has not been found which crystal plane is actually the main orientation plane.

That is, in the semiconductor film (crystal-containing semiconductor film) formed through the process of the present invention, either one crystal plane of the above-described six kinds of crystal planes occupies 80% or more (typically 90% or more) of all the crystal planes existing on the film surface.

As is well known in single crystal silicon as an example, interfacial properties are different for each crystal plane. The plane orientation in which interface state density (Qss) becomes minimum is the {100} plane, and the density becomes large in the order of the {511} plane, the {311} plane, the {111} plane, the crystal plane in which the {110} plane and the {100} plane are mixed, and the {110} plane. Incidentally, it is known that the {511} plane has interface state density comparable to the {100} plane.

Thus, if the main orientation plane of the semiconductor film formed through the process of the present invention is the {100} plane, interface state density at an interface between an active layer and a gate insulating film becomes very low. In that case, a semiconductor device comparable to a conventional IC in performance can be realized. Although described later, TFTs experimentally formed by actually using the present invention can form a circuit showing electrical characteristics comparable to a conventional IC.

Besides, in the process of the present invention, the furnace annealing treatment in the reduced atmosphere or inert gas atmosphere carried out after the laser annealing treatment is very effective in flattening an interface between an active layer and a gate insulating film. Particularly, in the case where the treatment is carried out in the reduced atmosphere, an extremely flat surface can be obtained through enhanced surface diffusion of semiconductor atoms on the surface of the semiconductor film.

As a result of measurement of surface roughness using AFM (Atomic Force Microscope) by the present applicant, a P-V value (difference in height between the top portion of a protrusion and the bottom portion of a recess) of the roughness within the range of 1 $\mu m^2$ was 10 nm or less (typically 5 nm or less), and a P-V value of the roughness within the range of 10 $\mu m^2$ was 20 nm or less (typically 10 nm or less).

[Embodiment 15]

Typical electrical characteristics of a TFT manufactured by carrying out the present invention are as follows:

(1) A subthreshold coefficient as an index of switching performance (promptness in switching of on/off operation) is as small as 60 to 150 mV/decade (typically 80 to 100 mv/decade) for both an N-channel TFT and a P-channel TFT when a drain voltage is 1 V.

(2) A field effect mobility ($\mu FE$) as an index of an operation speed of a TFT is as large as 200 to 500 cm$^2$/Vs (typically 300 to 400 cm$^2$/Vs) for an N-channel TFT, and 100 to 300 cm$^2$/Vs (typically 150 to 200 cm$^2$/Vs) for a P-channel TFT, when a drain voltage is 1 V.

(3) A threshold voltage (Vth) as an index of a driving voltage of a TFT is as small as −1.0 to 2.5 V (typically −0.5 to 1.5 V) for an N-channel TFT, and −2.5 to 1.0 V (typically −1.5 to 0.5 V) for a P-channel TFT, when a drain voltage is 14 V.

Besides, on the basis of data of measurements for 500 TFTs of the present invention, a normal probability graph was prepared and characteristic fluctuation was estimated by using the graph. As a result, it was found that 90 pieces (typically 95 pieces) in the 100 pieces fall within the range of the above-described electrical characteristics.

As described above, it has been ascertained that extremely superior switching characteristics and high speed operation characteristics can be realized.

[Embodiment 16]

In this embodiment, a shift register as a liquid crystal driver circuit was manufactured and its operation frequency was ascertained. As a result, in the shift register circuit in which a power supply voltage was 5 V and the number of stages was 50, an output pulse of an operation frequency of 80 to 200 MHz (typically 100 to 150 MHz) was obtained.

[Embodiment 17]

Figure 15A:
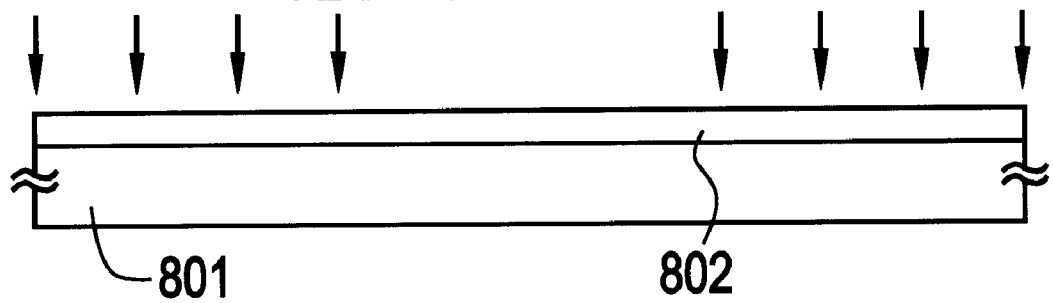
FIGS. 15A to 15C are views showing manufacturing steps of a thin film transistor.
Figure 15B:
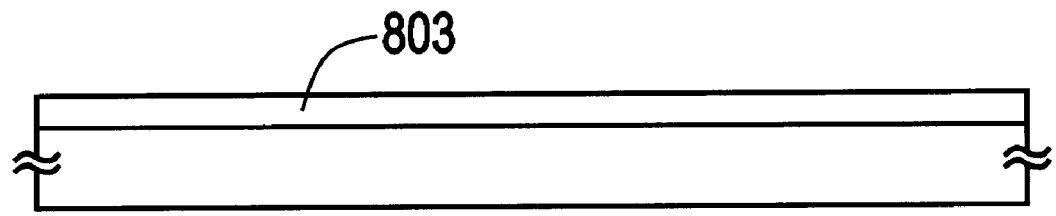
Figure 15C:
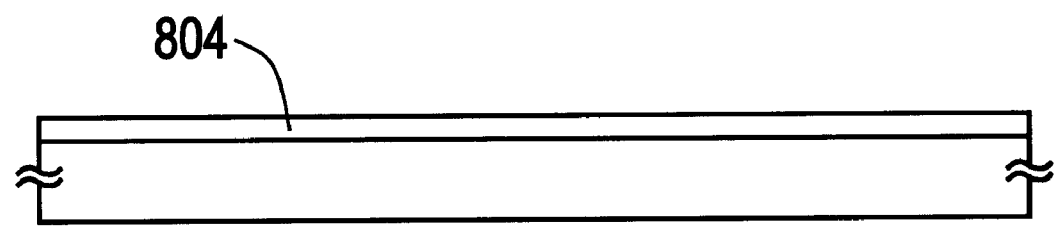

Although Embodiment 1 shows an example in which nickel is used as an element for promoting crystallization when an amorphous silicon film is crystallized, in this embodiment, an example in which germanium is used as the element will be described with reference to FIGS. 15A to 15C.

First, an amorphous silicon film 802 with a thickness of 80 nm is formed on a quartz substrate 801 in accordance with the steps of Embodiment 1. Then germanium is added to the amorphous silicon film 802. (FIG. 15A)

It is preferable to use an ion implantation method, a plasma doping method, or a laser doping method for the addition of germanium.

Besides, a method of making thermal diffusion after a germanium film is formed may be adopted, or a method of carrying out thermal diffusion after germanium is made to be adsorbed on amorphous silicon by spin coating of a germanium salt solution as in Embodiment 1 may be adopted. Alternatively, a method of making addition in advance at the time of film formation of the amorphous silicon film may be adopted.

In this embodiment, germane (GeH$_4$) is used as an excitation gas, and an ion implantation method is used under the condition that an acceleration voltage is 30 KeV, an RF power is 5 W, and a dosage is $1 \times 10^{14}$ atoms/cm$^2$, so that germanium is added of course, it is not necessary to make limitation to this condition, but adjustment has only to be made so that germanium with a concentration of $1 \times 10^{14}$ to $5 \times 10^{19}$ atoms/cm$^3$ (typically $1 \times 10^{16}$ to $5 \times 10^{18}$ atoms/cm$^3$) is added into the amorphous silicon film 802.

Incidentally, if the concentration of germanium added in the amorphous silicon film does not exceed $1 \times 10^{14}$ atoms/cm$^3$ (typically $1 \times 10^{16}$ atoms/cm$^3$ or more), the effect of promoting crystallization can not be positively used. On the other hand, if the addition concentration exceeds $5 \times 10^{19}$ atoms/cm$^3$, the melting point of the amorphous silicon film is lowered excessively so that there is a fear that the film is melted even at a temperature of about 900° C., which is not preferable. Thus, it is desirable that the upper limit of the addition amount is made about $1 \times 10^{18}$ atoms/cm$^3$ in view of safety.

Next, a heat treatment (furnace annealing) at 550° C. for 1 hour is carried out to transform the amorphous silicon film 802 into a polysilicon film 803. Of course, it is not necessary to make limitation to this condition, but the heat treatment in the temperature range as described in Embodiment 1 may be carried out. (FIG. 15B)

In the case of this embodiment, it is desirable that a treatment atmosphere is made an inert gas atmosphere or a reduced atmosphere. This reason will be described later.

After the crystallizing step of the amorphous silicon film is completed in this way, in accordance with Embodiment 1, a thinning step (thermal oxidation step) of the polysilicon film 803 is carried out. Actually, although a thermal oxidation film is formed, the film is not shown here. In this way, a polysilicon film 804 through the thinning step is obtained. (FIG. 15C)

At this time, there is a remarkable feature in the case where germanium is used. Germanium becomes germanium oxide by a heat treatment at 700° C. or more and is sublimated. That is, when the thinning step of the polysilicon film 803 is carried out, germanium is inevitably sublimated and is removed from the inside of the polysilicon film 803.

That is, the reason why it is desirable to carry out the crystallizing step in the inert gas atmosphere or the reduced atmosphere as described above is that if germanium oxide is prevented from being formed to the utmost degree, the function of germanium can be most effectively used.

As described in Embodiment 1 well, in the case where an element which promotes crystallization of a silicon film is used, it is ascertained that the temperature at which the amorphous silicon film is crystallized is about 600° C. Since the temperature is actually changed a little through a treatment temperature, it is permissible to consider that 550 to 650° C. is a temperature required for crystallization. That is, if the temperature at crystallization is raised up to only 650° C., there can hardly occur such a case that germanium is sublimated at the crystallization.

Although Embodiment 3 shows an example in which gettering is carried out by using phosphorus since nickel is used as an element for promoting crystallization, in this embodiment, an effect equivalent to the gettering step of the element can be obtained through only the heat treatment.

It is appropriate that one of furnace annealing, laser annealing, and lamp annealing is used as this heat treatment. Besides, by merely changing the heat treatment temperature after the crystallization step, it is also possible to sublimate germanium continuously without making opening to the air.

Besides, a halogen element may be added to the heat treatment atmosphere. Since the halogen element is combined with germanium to form volatile germanium halide, the gettering effect can be facilitated.

In the manner described above, at the same time as the thinning step, the element (germanium) used at the crystallization of the amorphous silicon film can be removed from the polysilicon film without increasing the number of steps.

Thereafter, in accordance with the same steps as those of Embodiment 1, a TFT as shown in FIG. 2D has only to be formed. Of course, it is also possible to combine this embodiment with the structure of Embodiment 2 or Embodiment 3, and this embodiment may be used at the manufacture of the semiconductor device shown in Embodiments 11 to 13.

Besides, although this embodiment shows an example in which only germanium is used as an element for promoting crystallization of the amorphous silicon film, other elements (nickel, cobalt, iron, palladium, platinum, copper, gold, lead, tin, etc.) and germanium may be used at the same time. In that case, there can be a necessity to combine gettering means as shown in Embodiment 3 with this embodiment.

[Embodiment 18]

Although Embodiment 5 shows an example in which nickel is used as an element for promoting crystallization when an amorphous silicon film is crystallized, in this embodiment, an example in which germanium is used as the element will be described with reference to FIGS. 16A to 16D.

Figure 16A:
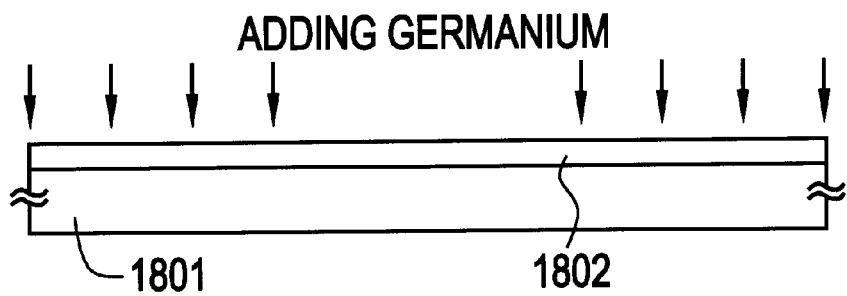
FIGS. 16A to 16D are views showing manufacturing steps of a thin film transistor.

First, in accordance with the steps of Embodiment 5, an amorphous silicon film 1802 with a thickness of 80 nm is formed on a quartz substrate 1801. Then, germanium is added to the amorphous silicon film 1802. (FIG. 16A)

It is preferable to use an ion implantation method, a plasma doping method, or a laser doping method for the addition of germanium.

Besides, a method of making thermal diffusion after a germanium film is formed may be adopted, or a method of making thermal diffusion after germanium is made to be adsorbed on amorphous silicon by spin coating of a germanium salt solution as in Embodiment 5 may be adopted. Alternatively, a method of making addition in advance at the time of the film formation of the amorphous silicon film may be adopted.

In this embodiment, germane ($GeH_4$) is used as an excitation gas, and an ion implantation method is used under the condition that an acceleration voltage is 30 KeV, an RF power is 5 W, and a dosage is $1 \times 10^{14}$ atoms/cm$^2$, so that germanium is added. Of course, it is not necessary to make limitation to this condition, but adjustment has only to be made so that germanium with a concentration of $1 \times 10^{14}$ to $5 \times 10^{19}$ atoms/cm$^3$ (typically $1 \times 10^{16}$ to $5 \times 10^{18}$ atoms/cm$^3$) is added in the amorphous silicon film 1802.

Incidentally, if the concentration of germanium added in the amorphous silicon film does not exceed $1 \times 10^{14}$ atoms/cm$^3$ (typically $1 \times 10^{16}$ atoms/cm$^3$ or more), the effect of promoting crystallization can not be positively used. On the other hand, if the addition concentration exceeds $5 \times 10^{19}$ atoms/cm$^3$. the melting point of the amorphous silicon film is lowered excessively, so that there is a fear that the film is melted even at a temperature of about 900° C., which is not preferable. Thus, it is desirable that the upper limit of the addition amount is made about $1 \times 10^{18}$ atoms/cm$^3$ in view of safety.

Figure 16B:
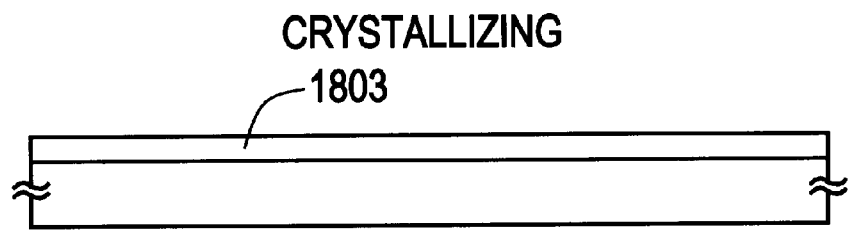

Next, a heat treatment (furnace annealing) at 550° C. for 1 hour is carried out to transform the amorphous silicon film 1802 into a polysilicon film 1803. Of course, it is not necessary to make limitation to this condition, but the heat treatment in the temperature range as described in Embodiment 1 may be carried out. (FIG. 16B)

Besides, in the case of this embodiment, it is desirable that a treatment atmosphere is made an inert gas atmosphere or a reduced atmosphere. This reason will be described later.

Figure 16C:
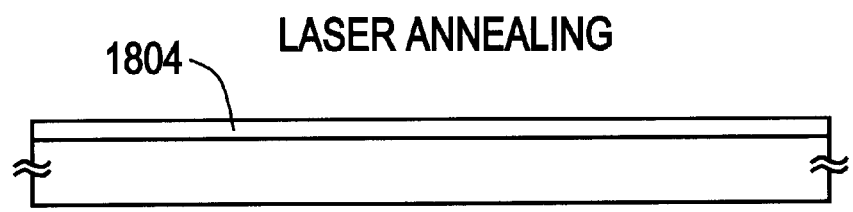

After the crystallizing step of the amorphous silicon film is completed in this way, in accordance with Embodiment 5, an irradiation step of excimer laser light is carried out. In this embodiment, irradiation of linear excimer laser light (wavelength: 248 nm) using KrF as an excitation gas is carried out. In this way, a polysilicon film 1804 in which its crystallinity is improved is obtained. (FIG. 16C)

Figure 16D:
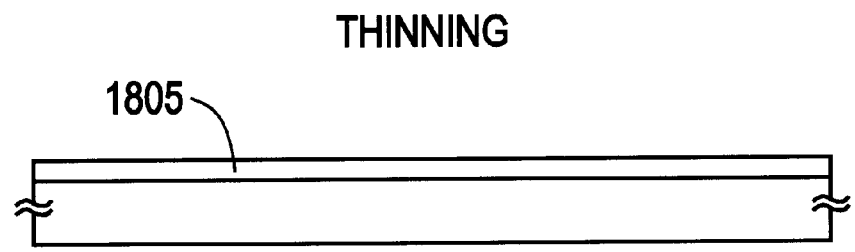

Next, a thermal oxidation step (thinning step) of the polysilicon film 1804 is carried out. Although a thermal oxidation film is actually formed, the film is not shown here. In this way, a polysilicon film 1805 through the thinning step is obtained. (FIG. 16D)

At this time, there is a remarkable feature in the case where germanium is used. Germanium becomes germanium oxide by a heat treatment at 700° C. or more and is sublimated. That is, when a thinning step of the polysilicon film 1804 is carried out, germanium is inevitably sublimated and is removed from the inside of the polysilicon film 1804.

That is, the reason why it is desirable to carry out the crystallizing step in the inert gas atmosphere or the reduced atmosphere as described above is that if germanium oxide is prevented from being formed to the utmost degree, the function of germanium can be most effectively used.

Incidentally, as described in Embodiment 5 as well, in the case where the element for crystallization of the amorphous silicon film is used, it is ascertained that the temperature at which the amorphous silicon film is crystallized is about 600° C. The temperature is actually changed a little through a treatment temperature, it is permissible to consider that 550 to 650° C. is a temperature required for crystallization. That is, if the temperature at crystallization is raised up to only 650° C., there can hardly occur such a case that germanium is sublimated at the crystallization.

Although Embodiment 9 shows an example in which gettering is carried out by using phosphorus since nickel is used as an element for promoting crystallization, in this embodiment, an effect equivalent to the gettering step of the element can be obtained through only the heat treatment.

This heat treatment can be carried out by not only the furnace annealing but also either means of laser annealing and lamp annealing.

Thus, it is also possible to sublimate germanium oxide by the laser annealing step shown in FIG. 16C. In that case, it is necessary to set an irradiation time (including the number of times of laser pulse irradiation) of laser light sufficiently long.

Besides, a halogen element may be added into the heat treatment atmosphere. Since the halogen element is combined with germanium to form volatile germanium halide, the gettering effect can be facilitated.

In the manner described above, at the same time as the thinning step, the element (germanium) used at the crystallization of the amorphous silicon film can be removed from the polysilicon film or can be decreased without increasing the number of steps.

Thereafter, in accordance with the same steps as Embodiment 5, a TFT as shown in FIG. 2D has only to be formed. Of course, it is also possible to combine this embodiment with any structure of Embodiments 6 to 9, and this embodiment may be used at the manufacture of the semiconductor device shown in Embodiments 11 to 13.

Besides, although this embodiment shows an example in which only germanium is used as an element for promoting crystallization of an amorphous silicon film, other elements (nickel, cobalt, iron, palladium, platinum, copper, gold, lead, tin, etc.) and germanium may be used at the same time. In that case, there can be a necessity to combine gettering means as shown in Embodiment 9 with this embodiment.

[Embodiment 19]

In Embodiment 17, although the description has been made on the case where an ion implantation method or the like is used as means for adding germanium in an amorphous silicon film, in this embodiment, an example in which germanium is added by thermal diffusion after formation of a germanium film will be described.

In the case of this embodiment, after an amorphous silicon film is formed, a germanium film with a thickness of 1 to 50 nm (typically 10 to 20 nm) is formed thereon. As a film formation method, a vapor phase method such as a plasma CVD method, a low pressure CVD method, and a sputtering method can be used.

Incidentally, the germanium film may be formed in such a manner that it is brought into direct contact with the amorphous silicon film, or may be provided through an insulating film. In the case where the insulating film is formed, if the insulating film is too thick, thermal diffusion of germanium into the silicon film is blocked, so that it is preferable that its thickness is made 10 to 30 nm.

When a crystallizing step is carried out in the state that the germanium film is provided, germanium is thermally diffused into the amorphous silicon film by heating and functions as an element for promoting crystallization.

The germanium film after the crystallizing step may be removed by oxidation or may be removed by a sulfuric acid peroxide solution ($H_2SO_4$:$H_2O_2$=1:1). Thereafter, when a heat treatment at 700° C. or more is carried out, germanium in the formed polysilicon film is removed or decreased.

The structure of this embodiment can be combined with any of Embodiments 1 to 17, and can be applied to any embodiment.

[Embodiment 20]

In this embodiment, a description will be made on the case where a spin coating method by solution application and a thermal diffusion method are used as means for adding germanium into an amorphous silicon film.

In the case of this embodiment, after an amorphous silicon film is formed, a solution containing germanium is applied onto the film. As such a solution, there is a germanium salt solution such as germanium oxide ($GeO_x$, typically $GeO_2$), germanium chloride ($GeCl_4$), germanium bromide ($GeBr_4$), germanium sulfide ($GeS_2$), and germanium acetate (Ge($CH_3CO_2$)).

As a solvent, an alcohol solvent such as ethanol or isopropyl alcohol may be used.

In this embodiment, a germanium oxide solution of 10 to 100 ppm is formed and is applied onto the amorphous silicon film (may be applied through an insulating film), and spin coating is carried out so that a germanium-containing layer is formed.

Incidentally, since the amorphous silicon film shows hydrophobicity, it is effective to increase wettability by forming an insulating film on the silicon film surface before spin coating. In this case, if the insulating film is too thick, thermal diffusion of germanium into the silicon film is blocked, so that it is preferable to make the thickness 10 to 30 nm.

When a crystallizing step is carried out in the state that the germanium-containing layer is provided in this way, germanium is thermally diffused into the amorphous silicon film by heating and functions as an element for promoting crystallization.

The structure of this embodiment can be combined with any of Embodiments 1 to 17 and can be applied to any embodiment.

As described above, when the present invention is carried out, a semiconductor film having crystallinity which can be regarded as substantially single crystal, can be obtained. Then a circuit is assembled with TFTs each having an active layer of such a semiconductor film, and a high performance semiconductor device can be realized.

What is claimed is:

1. A method of manufacturing a semiconductor device, comprising the steps of:
   forming a crystal-containing semiconductor film over a substrate;
   oxidizing the crystal-containing semiconductor film to decrease its thickness;
   carrying out a laser annealing treatment to the crystal-containing semiconductor film after the oxidizing step; and
   removing an oxide film formed on the crystal-containing semiconductor film; and
   carrying out a furnace annealing treatment to the crystal-containing semiconductor film after the removing step, wherein said furnace annealing treatment is carried out in a reducing atmosphere at 900 to 1200° C.

2. A method of manufacturing a semiconductor device according to claim 1, wherein the forming the crystal-containing semiconductor film is a step of crystallizing a noncrystal-containing semiconductor film by a thermal annealing treatment.

3. A method of manufacturing a semiconductor device according to claim 2, wherein an element selected from the group consisting of nickel, cobalt, iron, palladium, platinum, copper, gold, germanium, lead, and tin is added in the noncrystal-containing semiconductor film when the thermal annealing treatment is carried out.

4. A method of manufacturing a semiconductor device according to claim 2, wherein germanium is added in the noncrystal-containing semiconductor film by a method selected from the group consisting of an ion implantation method, a plasma doping method, and a laser doping method before the thermal annealing treatment is carried out.

5. A method of manufacturing a semiconductor device according to claim 1, wherein the oxidizing step is carried out through plural thermal oxidation steps.

6. A method of manufacturing a semiconductor device according to claim 1, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

7. A method of manufacturing a semiconductor device according to claim 1, wherein said oxide film is removed by using hydrofluoric acid.

8. A method of manufacturing a semiconductor device according to claim 1, wherein said semiconductor device is selected from the group consisting of a video camera, a digital camera, a projector, a goggle display, a vehicle navigation system, a personal computer, and a portable information terminal.

9. A method of manufacturing a semiconductor device, comprising the steps of:
   forming a crystal-containing semiconductor film over a substrate;
   oxidizing the crystal-containing semiconductor film to decrease its thickness;
   carrying out a laser annealing treatment with an energy density of 250 to 5000 mJ/cm$^2$ to the crystal-containing semiconductor film after the oxidizing step; and
   removing an oxide film formed on the crystal-containing semiconductor film; and
   carrying out a furnace annealing treatment at 900 to 1200° C. in a reducing atmosphere to the crystal-containing semiconductor film after the removing step.

10. A method of manufacturing a semiconductor device according to claim 9, wherein the forming the crystal-containing semiconductor film is a step of crystallizing a noncrystal-containing semiconductor film by a thermal annealing treatment.

11. A method of manufacturing a semiconductor device according to claim 10, wherein an element selected from the group consisting of nickel, cobalt, iron, palladium, platinum, copper, gold, germanium, lead, and tin is added in the noncrystal-containing semiconductor film when the thermal annealing treatment is carried out.

12. A method of manufacturing a semiconductor device according to claim 10, wherein germanium is added in the noncrystal-containing semiconductor film by a method selected from the group consisting of an ion implantation method, a plasma doping method, and a laser doping method before the thermal annealing treatment is carried out.

13. A method of manufacturing a semiconductor device according to claim 9, wherein the oxidizing step is carried out through plural thermal oxidation steps.

14. A method of manufacturing a semiconductor device according to claim 9, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

15. A method of manufacturing a semiconductor device according to claim 9, wherein the reducing atmosphere is one selected from the group consisting of a hydrogen atmosphere, an ammonia atmosphere, a mixed atmosphere of hydrogen and nitrogen, and a mixed atmosphere of hydrogen and argon.

16. A method of manufacturing a semiconductor device according to claim 9, wherein said oxide film is removed by using hydrofluoric acid.

17. A method of manufacturing a semiconductor device according to claim 9, wherein said semiconductor device is selected from the group consisting of a video camera, a digital camera, a projector, a goggle display, a vehicle navigation system, a personal computer, and a portable information terminal.

18. A method of manufacturing a semiconductor device, comprising the steps of:
   forming a crystal-containing semiconductor film over a substrate;
   carrying out a laser annealing treatment with an energy density of 250 to 5000 mJ/cm$^2$ to the crystal-containing semiconductor film;
   carrying out a furnace annealing treatment at 900 to 1200° C. in a reducing atmosphere to the crystal-containing semiconductor film after the laser annealing step; and
   oxidizing the crystal-containing semiconductor film after the furnace annealing step to decrease its thickness.

19. A method of manufacturing a semiconductor device according to claim 18, wherein the furnace annealing treatment is carried out through plural thermal oxidation steps.

20. A method of manufacturing a semiconductor device according to claim 18, wherein the forming the crystal-containing semiconductor film is a step of crystallizing a noncrystal-containing semiconductor film by a thermal annealing treatment.

21. A method of manufacturing a semiconductor device according to claim 20, wherein an element selected from the group consisting of nickel, cobalt, iron, palladium, platinum, copper, gold, germanium, lead, and tin is added in the noncrystal-containing semiconductor film before the thermal annealing treatment is carried out.

22. A method Of manufacturing a semiconductor device according to claim 20, wherein germanium is added in the noncrystal-containing semiconductor film by a method selected from the group consisting of an ion implantation method, a plasma doping method, and a laser doping method before the thermal annealing treatment is carried out.

23. A method of manufacturing a semiconductor device according to claim 18, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

24. A method of manufacturing a semiconductor device according to claim 18, wherein the semiconductor device is one selected from the group consisting of a microprocessor, a signal processing circuit, and a high frequency circuit.

25. A method of manufacturing a semiconductor device according to claim 18, wherein the semiconductor device is one selected from the group consisting of a video camera, a digital camera, a projector, a goggle display, a navigation system for vehicles, a personal computer, and a portable information terminal.

26. A method of manufacturing a semiconductor device, comprising the steps of:
   forming a crystal-containing semiconductor film over a substrate;
   carrying out a laser annealing treatment with an energy density of 250 to 5000 mJ/cm$^2$ to the crystal-containing semiconductor film;
   removing an oxide film formed on the crystal-containing semiconductor film;
   carrying out a furnace annealing treatment at 900 to 1200° C. in a reducing atmosphere to the crystal-containing semiconductor film after the removing step; and
   oxidizing the crystal-containing semiconductor film after the furnace annealing step to decrease its thickness.

27. A method of manufacturing a semiconductor device according to claim 26, wherein the furnace annealing treatment is carried out through plural thermal oxidation steps.

28. A method of manufacturing a semiconductor device according to claim 26, wherein the forming the crystal-containing semiconductor film is a step of crystallizing a noncrystal-containing semiconductor film by a thermal annealing treatment.

29. A method of manufacturing a semiconductor device according to claim 28, wherein an element selected from the group consisting of nickel, cobalt, iron, palladium, platinum, copper, gold, germanium, lead, and tin is added in the noncrystal-containing semiconductor film before the thermal annealing treatment is carried out.

30. A method of manufacturing a semiconductor device according to claim 28, wherein germanium is added in the noncrystal-containing semiconductor film by a method selected from the group consisting of an ion implantation method, a plasma doping method, and a laser doping method before the thermal annealing treatment is carried out.

31. A method of manufacturing a semiconductor device according to claim 26, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

32. A method of manufacturing a semiconductor device according to claim 26, wherein the reducing atmosphere is one selected from the group consisting of a hydrogen atmosphere, an ammonia atmosphere, a mixed atmosphere of hydrogen and nitrogen, and a mixed atmosphere of hydrogen and argon.

33. A method of manufacturing a semiconductor device according to claim 26, wherein the semiconductor device is one selected from the group consisting of a microprocessor, a signal processing circuit, and a high frequency circuit.

34. A method of manufacturing a semiconductor device according to claim 26, wherein the semiconductor device is one selected from the group consisting of a video camera, a digital camera, a projector, a goggle display, a navigation system for vehicles, a personal computer, and a portable information terminal.

35. A method of manufacturing a semiconductor device according to claim 26, wherein said oxide film is removed by using hydrofluoric acid.

36. A method of manufacturing a semiconductor device, comprising the steps of:
  forming a crystal-containing semiconductor film over a substrate;
  carrying out a laser annealing treatment to the crystal-containing semiconductor film;
  oxidizing the crystal-containing semiconductor film after the laser annealing step to decrease its thickness; and
  removing an oxide film formed on the crystal-containing semiconductor film; and
  carrying out a furnace annealing treatment to the crystal-containing semiconductor film after the removing step, wherein said furnace annealing treatment is carried out in a reducing atmosphere at 900 to 1200° C.

37. A method of manufacturing a semiconductor device according to claim 36, wherein the oxidizing step is carried out through plural thermal oxidation steps.

38. A method of manufacturing a semiconductor device according to claim 36, wherein the forming the crystal-containing semiconductor film is a step of crystallizing a noncrystal-containing semiconductor film by a thermal annealing treatment.

39. A method of manufacturing a semiconductor device according to claim 38, wherein an element selected from the group consisting of nickel, cobalt, iron, palladium, platinum, copper, gold, germanium, lead, and tin is added in the noncrystal-containing semiconductor film before the thermal annealing treatment is carried out.

40. A method of manufacturing a semiconductor device according to claim 38, wherein germanium is added in the noncrystal-containing semiconductor film by a method selected from the group consisting of an ion implantation method, a plasma doping method, and a laser doping method before the thermal annealing treatment is carried out.

41. A method of manufacturing a semiconductor device according to claim 36, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

42. A method of manufacturing a semiconductor device according to claim 36, wherein the reducing atmosphere is one selected from the group consisting of a hydrogen atmosphere, an ammonia atmosphere, a mixed atmosphere of hydrogen and nitrogen, and a mixed atmosphere of hydrogen and argon.

43. A method of manufacturing a semiconductor device according to claim 36, wherein the semiconductor device is one selected from the group consisting of a microprocessor, a signal processing circuit, and a high frequency circuit.

44. A method of manufacturing a semiconductor device according to claim 36, wherein the semiconductor device is one selected from the group consisting of a video camera, a digital camera, a projector, a goggle display, a navigation system for vehicles, a personal computer, and a portable information terminal.

45. A method of manufacturing a semiconductor device according to claim 36, wherein said oxide film is removed by using hydrofluoric acid.

46. A method of manufacturing a semiconductor device, comprising the steps of:
  forming a crystal-containing semiconductor film over a substrate;
  carrying out a laser annealing treatment with an energy density of 250 to 5000 mJ/cm² to the crystal-containing semiconductor film;
  oxidizing the crystal-containing semiconductor film after the laser annealing step to decrease its thickness;
  removing an oxide film formed on the crystal-containing semiconductor film; and
  carrying out a furnace annealing treatment at 900 to 1200° C. in a reducing atmosphere to the crystal-containing semiconductor film after the removing step.

47. A method of manufacturing a semiconductor device according to claim 46, wherein the oxidizing step is carried out through plural thermal oxidation steps.

48. A method of manufacturing a semiconductor device according to claim 46, wherein the forming the crystal-containing semiconductor film is a step of crystallizing a noncrystal-containing semiconductor film by a thermal annealing treatment.

49. A method of manufacturing a semiconductor device according to claim 48, wherein an element selected from the group consisting of nickel, cobalt, iron, palladium, platinum, copper, gold, germanium, lead, and tin is added in the noncrystal-containing semiconductor film before the thermal annealing treatment is carried out.

50. A method of manufacturing a semiconductor device according to claim 48, wherein germanium is added in the noncrystal-containing semiconductor film by a method selected from the group consisting of an ion implantation method, a plasma doping method, and a laser doping method before the thermal annealing treatment is carried out.

51. A method of manufacturing a semiconductor device according to claim 46, wherein when light intensity ($E_0$) of laser light oscillated from a laser oscillator, transmittance (a) of an attenuator, transmittance (b) of an optical system, and laser irradiation area (A) are used, the energy density (E) is expressed by $E=(E_0 \times a \times b)/A$.

52. A method of manufacturing a semiconductor device according to claim 46, wherein the reducing atmosphere is one selected from the group consisting of a hydrogen atmosphere, an ammonia atmosphere, a mixed atmosphere of hydrogen and nitrogen, and a mixed atmosphere of hydrogen and argon.

53. A methods of manufacturing a semiconductor device according to claim 46, wherein the semiconductor device is one selected from the group consisting of a microprocessor, a signal processing circuit, and a high frequency circuit.

54. A method of manufacturing a semiconductor device according to claim 46, wherein the semiconductor device is one selected from the group consisting of a video camera, a digital camera, a projector, a goggle display, a navigation system for vehicles, a personal computer, and a portable information terminal.

55. A method of manufacturing a semiconductor device, comprising the steps of:
  forming a semiconductor film comprising crystalline silicon over a substrate;

oxidizing the surface of the semiconductor film to decrease its thickness;

removing an oxide film formed on the crystal-containing semiconductor film after the oxidizing step;

carrying out a laser annealing treatment to the semiconductor film after the removing said oxide film;

removing an oxide film formed on the crystal-containing semiconductor film; and carrying out a furnace annealing treatment to the semiconductor film after the removing step, wherein said furnace annealing treatment is carried out in a nitrogen atmosphere at 900 to 1200° C.

56. A method of manufacturing a semiconductor device according to claim 55, wherein said oxide film is removed by using hydrofluoric acid.

57. A method of manufacturing a semiconductor device according to claim 55, wherein said semiconductor device is an EL display device.

58. A method of manufacturing a semiconductor device according to claim 55, wherein said semiconductor device is an liquid crystal display device.

59. A method of manufacturing a semiconductor device according to claim 55, wherein said semiconductor device is selected from the group consisting of a microprocessor and a signal processing circuit.

60. A method of manufacturing a semiconductor device according to claim 55, wherein said semiconductor device is selected from the group consisting of a video camera, a digital camera, a projector, a goggle display, a vehicle navigation system, a personal computer, and a portable information terminal.

61. A method of manufacturing a semiconductor device, comprising the steps of:

forming a semiconductor film comprising crystalline silicon over a substrate;

oxidizing the surface of the semiconductor film to decrease its thickness;

carrying out a laser annealing treatment to the semiconductor film after the oxidizing step;

removing an oxide film formed on the crystal-containing semiconductor film after the laser annealing treatment;

carrying out a furnace annealing treatment to the semiconductor film after tie removing step, wherein said furnace annealing treatment is carried out in a nitrogen atmosphere at 900 to 1200° C.

62. A method of manufacturing a semiconductor device according to claim 61, wherein said oxide film is removed by using hydrofluoric acid.

63. A method of manufacturing a semiconductor device according to claim 61, wherein said semiconductor device is an EL display device.

64. A method of manufacturing a semiconductor device according to claim 61, wherein said semiconductor device is an liquid crystal display device.

65. A method of manufacturing a semiconductor device according to claim 61, wherein said semiconductor device is selected from the group consisting of a microprocessor and a signal processing circuit.

66. A method of manufacturing a semiconductor device according to claim 61, wherein said semiconductor device is selected from the group consisting of a video camera, a digital camera, a projector, a goggle display, a vehicle navigation system, a personal computer, and a portable information terminal.

* * * * *

UNITED STATES PATENT AND TRADEMARK OFFICE
CERTIFICATE OF CORRECTION

PATENT NO. : 6,559,036 B1
DATED : May 6, 2003
INVENTOR(S) : Hisashi Ohtani et al.

It is certified that error appears in the above-identified patent and that said Letters Patent is hereby corrected as shown below:

<u>Column 16, line 63 through Column 18, line 5,</u>
Replace with the following:

Besides, in the case of this embodiment, it is preferable to carry out the laser annealing treatment under the condition that the laser energy density is 250 to 5000 mJ/cm$^2$ (preferably 450 to 1000 mJ/cm$^2$). In this embodiment, the laser energy density was made 550 mJ/cm$^2$. Here, a method of measuring the laser energy density in the present specification will be explained.

First, light intensity ($E_0$) of laser light oscillated from a laser oscillator is measured by a power meter. However, the laser light after having passed through the power meter is attenuated in accordance with transmittance (a) of an attenuator, and is further attenuated in accordance with transmittance (b) of an optical system. Laser energy density (E) is obtained by dividing the light intensity of the laser light attenuated in this way by a laser irradiation area (A). This is expressed by an expression of $E=(E_0 \times a \times b)/A$.

After the state of FIG. 5C was obtained in this way, a furnace annealing treatment (heat treatment using an electrothermal furnace) at 1000° C for 30 minutes was carried out in an oxidizing atmosphere. At this time, the film thickness of the polysilicon film 1105 was decreased (thinning treatment) by the thermal oxidation treatment, so that a polysilicon film 1106 thinner than the polysilicon film 1105 was formed. (FIG. 5D)

Incidentally, although not shown in FIG. 5D, a thermal oxidation film is formed on the polysilicon film 1105. This thermal oxidation film may be removed, or may be actively used as a protection film in a subsequent laser annealing step.

In this thermal oxidation step, defects or the like in the polysilicon film are repaired by surplus silicon atoms produced when the oxidizing reaction proceeds, so that it was possible to obtain the polysilicon film with very few defects. Besides, the thickness of the polysilicon film was decreased, so that the initial thickness of 90 nm was changed to 60 nm.

Moreover, since the oxidizing reaction progressed while scraping the surface layer of the polysilicon film, the formed polysilicon film 1106 became a semiconductor film with a very flat surface. This effectively serves to decrease levels in an interface between an active layer and a gate insulating film of a TFT.

Incidentally, when this thinning step is repeated plural times, the flatness of the polysilicon film is further improved. In that case, the thermal oxidation step and the removing step of the thermal oxidation film are alternately repeated.

Incidentally, in this embodiment, since the amorphous silicon film with a thickness of 90 nm is used as an initial film, the thinning step is adopted. However, if the thickness of the initial film is made 50 nm or less to eliminate the necessity of thinning more, the thinning step can also be omitted.

Next, a furnace annealing treatment at 1000° C. for 2 hours was carried out to the polysilicon film 1106 obtained by carrying out this thinning step. In this embodiment, although the treatment atmosphere is made a hydrogen atmosphere, there is no problem as long as a reduced atmosphere is used. Even if an inert gas atmosphere such as a nitrogen atmosphere is used, an object of improving the crystallinity can be achieved. (FIG. 5E)

UNITED STATES PATENT AND TRADEMARK OFFICE
CERTIFICATE OF CORRECTION

PATENT NO. : 6,559,036 B1
DATED : May 6, 2003
INVENTOR(S) : Hisashi Ohtani et al.

It is certified that error appears in the above-identified patent and that said Letters Patent is hereby corrected as shown below:

Column 16 (cont'd),

Incidentally, it is desirable to wash the surface of the polysilicon film 1106 by a hydrofluoric acid based etchant before this furnace annealing step is carried out. That is, such contrivance is effective that a natural oxidation film is removed and silicon atoms on the surface are made to be terminated with hydrogen to prevent a natural oxidation film from being formed before an actual treatment.

However, attention must be paid especially to the point that the concentration of oxygen or an oxygen compound (for example, OH group) contained in the atmosphere is made 10 ppm or less (preferably 1 ppm or less). Otherwise, the flattening effect by the heat treatment in the reduced atmosphere is weakened.

In this way, a polysilicon film 1107 was obtained. The polysilicon film 1107 had a very flat surface by the hydrogen annealing at a high temperature such as 1000° C. Besides, since the annealing was carried out at a high temperature, stacking fault and the like hardly existed in the crystal grains.

Signed and Sealed this

Fourteenth Day of September, 2004

JON W. DUDAS
*Director of the United States Patent and Trademark Office*